(12) United States Patent
Tsai et al.

(10) Patent No.: US 9,511,994 B2
(45) Date of Patent: *Dec. 6, 2016

(54) ALUMINUM NITRIDE (ALN) DEVICES WITH INFRARED ABSORPTION STRUCTURAL LAYER

(71) Applicant: INVENSENSE, INC., San Jose, CA (US)

(72) Inventors: Julius Ming-Lin Tsai, San Jose, CA (US); Michael J. Daneman, Campbell, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/480,051

(22) Filed: Sep. 8, 2014

(65) Prior Publication Data
US 2015/0298965 A1   Oct. 22, 2015

Related U.S. Application Data

(63) Continuation-in-part of application No. 13/687,304, filed on Nov. 28, 2012, now Pat. No. 9,114,977.
(Continued)

(51) Int. Cl.
*H01L 29/84* (2006.01)
*B81C 1/00* (2006.01)

(52) U.S. Cl.
CPC ........ *B81C 1/00182* (2013.01); *B81B 2207/07* (2013.01); *B81C 2201/019* (2013.01)

(58) Field of Classification Search
USPC ................................................ 257/254, 253
See application file for complete search history.

(56) References Cited

U.S. PATENT DOCUMENTS 3,748,502 A    7/1973   Bernstein
5,963,679 A   10/1999   Setlak
(Continued)

FOREIGN PATENT DOCUMENTS

CN    1848472 A    10/2006
CN    1975956 A     6/2007
(Continued)

OTHER PUBLICATIONS

Office Action dated Jan. 30, 2014 for U.S. Appl. No. 13/687,304, 8 pages.
(Continued)

*Primary Examiner* — Timor Karimy
(74) *Attorney, Agent, or Firm* — Amin, Turocy & Watson, LLP

(57) ABSTRACT

A micro-electro-mechanical system device is disclosed. The micro-mechanical system device comprises a first silicon substrate comprising: a handle layer comprising a first surface and a second surface, the second surface comprises a cavity; an insulating layer deposited over the second surface of the handle layer; a device layer having a third surface bonded to the insulating layer and a fourth surface; a piezoelectric layer deposited over the fourth surface of the device layer; a metal conductivity layer disposed over the piezoelectric layer; a bond layer disposed over a portion of the metal conductivity layer; and a stand-off formed on the first silicon substrate; wherein the first silicon substrate is bonded to a second silicon substrate, comprising: a metal electrode configured to form an electrical connection between the metal conductivity layer formed on the first silicon substrate and the second silicon substrate.

15 Claims, 20 Drawing Sheets

Related U.S. Application Data

(60) Provisional application No. 61/880,110, filed on Sep. 19, 2013.

(56) References Cited

U.S. PATENT DOCUMENTS

| | | | |
|---|---|---|---|
| 7,013,031 | B2 | 3/2006 | Kim et al. |
| 7,053,529 | B2 | 5/2006 | Knowles |
| 7,067,962 | B2 | 6/2006 | Scott |
| 7,109,642 | B2 | 9/2006 | Scott |
| 7,400,750 | B2 | 7/2008 | Nam |
| 7,459,836 | B2 | 12/2008 | Scott |
| 7,489,066 | B2 | 2/2009 | Scott et al. |
| 7,739,912 | B2 | 6/2010 | Schneider et al. |
| 8,139,827 | B2 | 3/2012 | Schneider et al. |
| 8,335,356 | B2 | 12/2012 | Schmitt |
| 8,433,110 | B2 | 4/2013 | Kropp et al. |
| 8,508,103 | B2 | 8/2013 | Schmitt et al. |
| 8,515,135 | B2 | 8/2013 | Clarke et al. |
| 8,666,126 | B2 | 3/2014 | Lee et al. |
| 8,703,040 | B2 | 4/2014 | Liufu et al. |
| 8,723,399 | B2 | 5/2014 | Sammoura et al. |
| 8,805,031 | B2 | 8/2014 | Schmitt |
| 9,056,082 | B2 | 6/2015 | Liautaud et al. |
| 2004/0094815 | A1 | 5/2004 | Park et al. |
| 2005/0146401 | A1 | 7/2005 | Tilmans et al. |
| 2006/0012583 | A1 | 1/2006 | Knowles et al. |
| 2007/0096605 | A1 | 5/2007 | Fujii et al. |
| 2007/0230754 | A1 | 10/2007 | Jain et al. |
| 2008/0198145 | A1 | 8/2008 | Knowles et al. |
| 2009/0274343 | A1 | 11/2009 | Clarke |
| 2010/0239751 | A1 | 9/2010 | Regniere |
| 2010/0251824 | A1 | 10/2010 | Schneider et al. |
| 2010/0256498 | A1 | 10/2010 | Tanaka |
| 2011/0210554 | A1 | 9/2011 | Boysel |
| 2011/0285244 | A1 | 11/2011 | Lewis et al. |
| 2012/0016604 | A1 | 1/2012 | Irving et al. |
| 2012/0092026 | A1 | 4/2012 | Liautaud et al. |
| 2012/0147698 | A1 | 6/2012 | Wong et al. |
| 2012/0167823 | A1 | 7/2012 | Gardner et al. |
| 2012/0279865 | A1 | 11/2012 | Regniere et al. |
| 2012/0288641 | A1 | 11/2012 | Diatezua et al. |
| 2012/0319220 | A1 | 12/2012 | Noda et al. |
| 2013/0032906 | A1 | 2/2013 | Ogawa et al. |
| 2013/0127592 | A1 | 5/2013 | Fyke et al. |
| 2013/0133428 | A1 | 5/2013 | Lee et al. |
| 2013/0201134 | A1 | 8/2013 | Schneider et al. |
| 2013/0210175 | A1 | 8/2013 | Hoisington et al. |
| 2014/0145244 | A1 | 5/2014 | Daneman et al. |
| 2014/0176332 | A1 | 6/2014 | Alameh et al. |
| 2014/0219521 | A1 | 8/2014 | Schmitt et al. |
| 2014/0355387 | A1 | 12/2014 | Kitchens, II et al. |
| 2015/0036065 | A1 | 2/2015 | Yousefpor et al. |
| 2015/0169136 | A1 | 6/2015 | Ganti et al. |
| 2015/0189136 | A1 | 7/2015 | Chung et al. |
| 2015/0220767 | A1 | 8/2015 | Yoon et al. |
| 2015/0261261 | A1 | 9/2015 | Bhagavatula et al. |
| 2015/0286312 | A1 | 10/2015 | Kang et al. |

FOREIGN PATENT DOCUMENTS

| | | |
|---|---|---|
| CN | 102590555 A | 7/2012 |
| CN | 103026520 A | 4/2013 |
| EP | 1533743 A1 | 5/2005 |
| KR | 20090010357 A | 1/2009 |
| WO | 2009137106 A2 | 11/2009 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |

OTHER PUBLICATIONS

Office Action dated May 28, 2014 for U.S. Appl. No. 13/687,304, 9 pages.

Office Action dated Sep. 16, 2014 for U.S. Appl. No. 13/687,304, 8 pages.

International Search Report and Written Opinion for PCT Application No. PCT/US2015/043329, dated Nov. 2, 2015, 12 pgs.

Office Action for Taiwanese Application No. 103132242 dated Dec. 8, 2015, 14 pgs. including translation.

Partial International Search Report dated Jan. 4, 2016 for PCT Application Serial No. PCT/US2015/048964, 7 pages.

Wygant, et al., "Integration of 2D CMUT Arrays with Front-End Electronics for Volumetric Ultrasound Imaging," IEEE Transactions on Ultrasonics, Ferroelectrics, and Frequency Control, Feb. 2008, 16 pages, vol. 55 No. 2.

Fesenko, "Capacitive Micromachined Ultrasonic Transducer (cMUT) for Biometric Applications," Thesis for the Degree of Erasmus Mundus Master of Nanoscience and Nanotechnology, 2012, 46 pages, Goteborg, Sweden.

Vanagas, et al., "Study of the CMUT Operation in Microfluidic Application," Paper 10: 344-2012 IEEE International Ultrasonics Symposium. Last accessed Jun. 26, 2014, 4 pages.

Feng, et al., "Touch Panel with Integrated Fingerprint Sensors Based User Identity Management," Last accessed Jul. 20, 2014, 7 pages.

Singh, "Fingerprint Sensing Techniques, Devices and Applications," Apr. 2003, 31 pages.

"Capacitive Micromachined Ultrasonic Transducers," Wikipedia, Last accessed Jun. 25, 2014, 4 pages.

Schmitt, et al., "Surface Acoustic Impediography: A New Technology for Fingerprint Mapping and Biometric Identification: A Numerical Study," Proc. SPIE 5403, Sensors, and Command, Control, Communications, and Intelligence (C3I) Technologies for Homeland Security and Homeland Defense III, 309, Sep. 15, 2004, 2 pages.

"General Description and Advantages of CMUTs". Last accessed Jun. 26, 2014, 5 pages.

Khuri-Yakub, et al. "Next-gen ultrasound ," IEEE Spectrum, vol. 46, No. 5, pp. 44-54, May 2009.

Lamberti, et al. "A high frequency cMUT probe for ultrasound imaging of fingerprints," Sensors and Actuators A: Physical 172 (2), pp. 561-569. 2011.

Iula, et al. "Capacitive Microfabricated Ultrasonic Transducers for Biometric Applications"; Microelectronic Engineering, vol. 88, Issue 8, 2011, pp. 2278-2280.

Tang, et al. "Pulse-Echo Ultrasonic Fingerprint Sensor on a Chip," University of California, Berkeley, CA, USA, 2013.

Lu, et al. "High frequency piezoelectric micromachined ultrasonic transducer array for intravascular ultrasound imaging." Micro Electro Mechanical Systems (MEMS), 2014 IEEE 27th International Conference on. IEEE, 2014.

Olsson, III, et al. "Post-CMOS-Compatible Aluminum Nitride Resonant MEMS Accelerometers." Journal of Microelectromechanical Systems, vol. 18, No. 3, Jun. 2009.

Wojciechowski, et al. "Single-chip precision oscillators based on multi-frequency, high-Q aluminum nitride MEMS resonators." Solid-State Sensors, Actuators and Microsystems Conference, 2009. Transducers 2009. International. IEEE, 2009.

Savoia et al. "Design and Fabrication of a cMUT Probe for Ultrasound Imaging of Fingerprints" 2010 IEEE International Ultrasonics Symposium Proceedings; Publication [online] Oct. 2010 [retrieved Oct. 7, 2014] Retrieved from Internet: <http://ieeexplore.ieee.org/xpl/login.jsp?tp=&arnumber=5935836>; pp. 1877-1880.

Dausch et al. "Theory and Operation of 2-D Array Piezoelectric Micromachined Ultrasound Transducers" IEEE Transactions on Ultrasonics, Ferroelectrics, and Frequency Control, vol. 55, No. 11, Nov. 2008; Retrieved from Internet on [Dec. 9, 2014]: <https:llrti.org/pubs/dauschtuffcv55is11 p2484nov2008.pdf >.

Qiu et al. "Piezoelectric Micromachined Ultrasound Transducer (PMUT) Arrays for Integrated Sensing, Actuation and Imaging"; Sensors 2015, 15, 8020-8041; doi: 1 0.3390/s150408020; Retrieved from Internet [Dec. 9, 2015] : <http://www.mdpi.com/1424-8220/15/4/8020/pdf>.

Chinese Office Action dated Feb. 3, 2016 for Chinese Application Serial No. 201410483646.X, 12 pages.

(56) References Cited

OTHER PUBLICATIONS

International Search Report and Written Opinion dated Mar. 14, 2016 for PCT Application Serial No. PCT/US2015/048964, 16 pages.

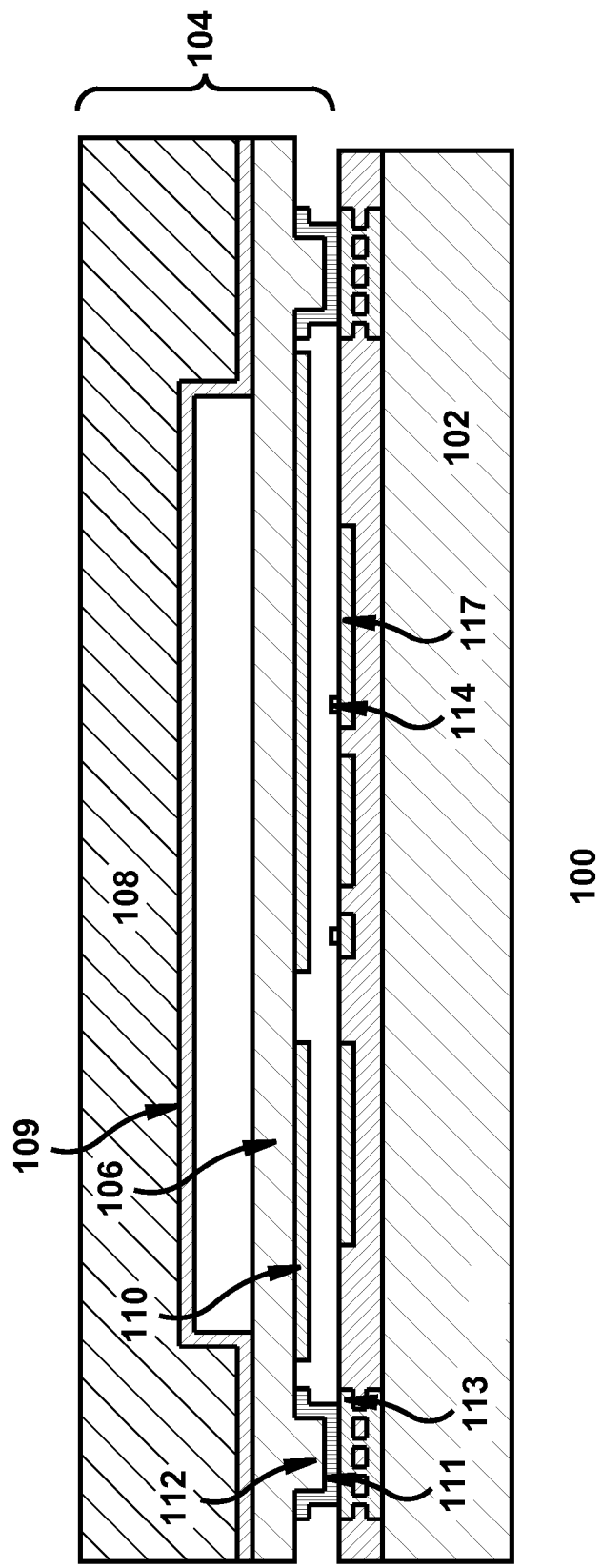

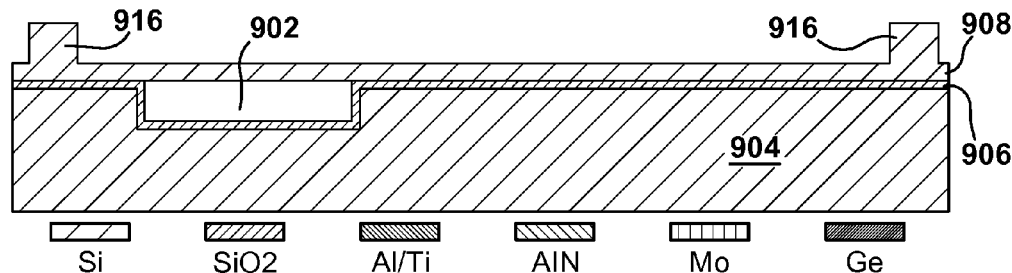
Fig. 12A(i)
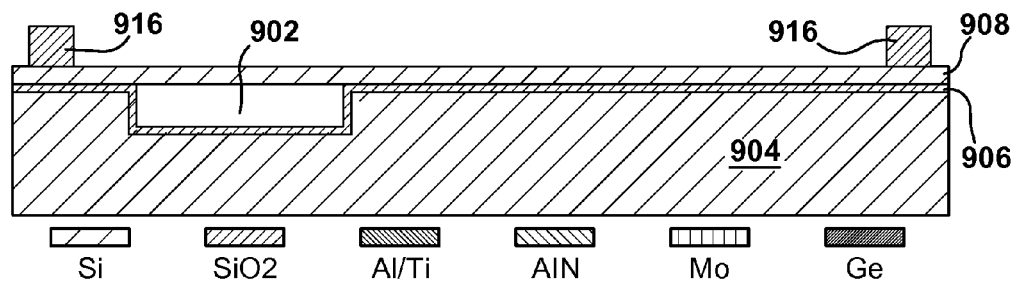
Fig. 12A(ii)
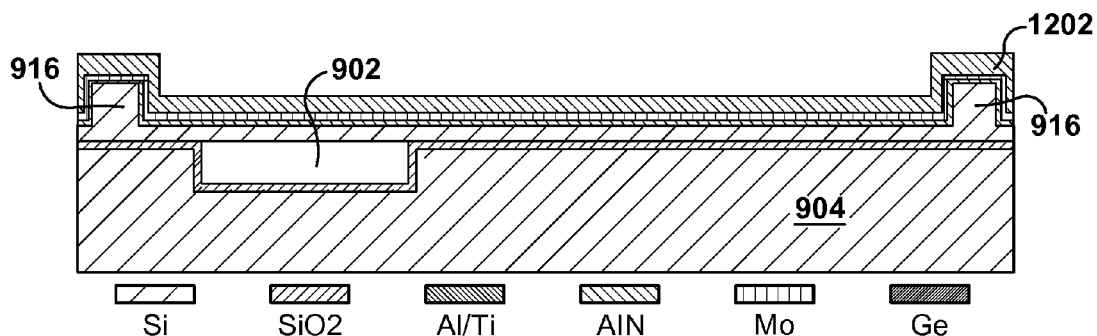
Fig. 12B(i)
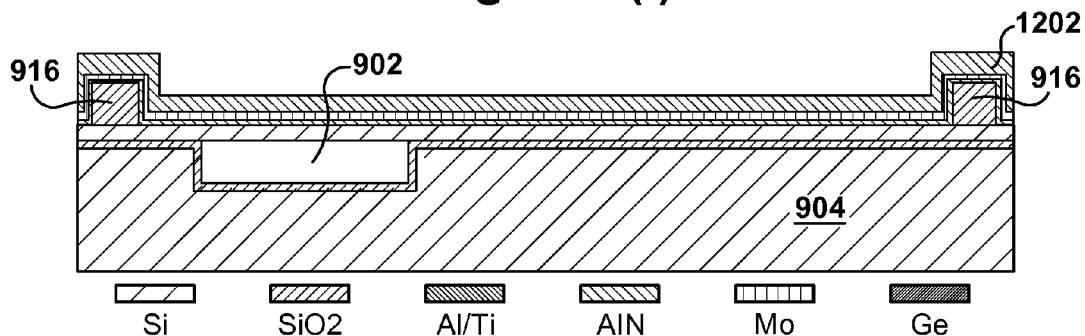
Fig. 12B(ii)

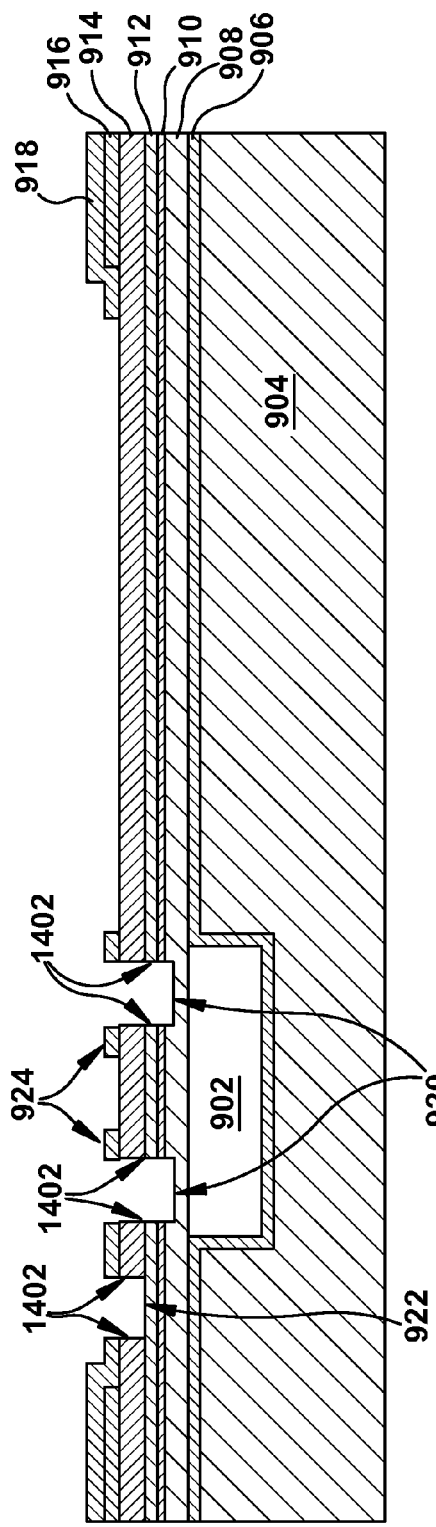
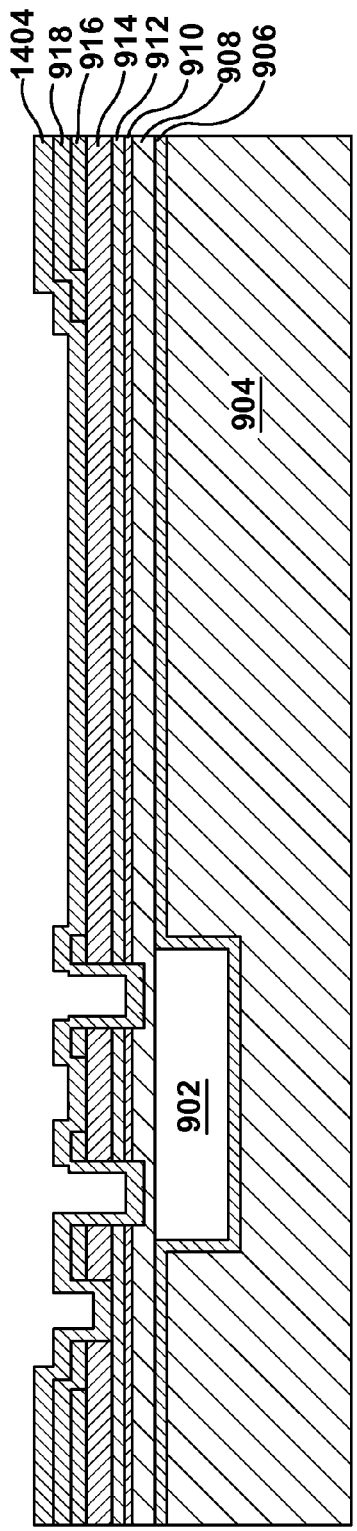
Fig. 14A
Fig. 14B

ALUMINUM NITRIDE (ALN) DEVICES WITH INFRARED ABSORPTION STRUCTURAL LAYER

PRIORITY CLAIM

This patent application is a continuation-in-part application that claims priority to U.S. patent application Ser. No. 13/687,304, filed Nov. 28, 2012, entitled "MEMS DEVICE AND PROCESS FOR RF AND LOW RESISTANCE APPLICATIONS", and U.S. Provisional Patent Application No. 61/880,110, filed Sep. 19, 2013, entitled "ALUMINUM NITRIDE (AlN) DEVICES WITH IR ABSORPTION STRUCTURAL LAYER AND METHOD OF FABRICATING THE SAME". The entirety of the aforementioned applications are incorporated by reference herein.

TECHNICAL FIELD

The subject disclosure relates to micro-electro-mechanical (MEMS) devices, to MEMS devices for Radio Frequency (RF) and low parasitics applications and fabricating aluminum nitride (AlN) devices with infrared absorption structural layers.

BACKGROUND

Micro-Electro-Mechanical Systems (MEMS) are a widely used technology that enables integration of both microelectronic circuits and mechanical structures on a single chip, thereby significantly lowering fabrication costs and chip size. There is a strong need for a cost-effective solution that can be utilized in low parasitics applications.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

MEMS devices for low parasitics applications are disclosed. In a first aspect, the MEMS device comprises a MEMS wafer including a handle wafer with one or more cavities containing a first surface and a second surface and an insulating layer deposited on the second surface of the handle wafer. The MEMS device also includes a device layer having a third and fourth surface, the third surface bonded to the insulating layer of the second surface of the handle wafer; and a metal conductive layer on the fourth surface. The MEMS device also includes a complementary metal-oxide-semiconductor (CMOS) wafer bonded to the MEMS wafer. The CMOS wafer includes at least one metal electrode, such that an electrical connection is formed between the at least one metal electrode and at least a portion of the metal conductive layer.

In a second aspect, a MEMS device comprises a MEMS substrate comprising a moveable portion and one or more stand-offs protruding from the substrate; an aluminum layer deposited onto the one or more stand-offs. The MEMS substrate includes an electrically conductive diffusion barrier layer disposed on top of the aluminum layer; and a germanium layer disposed on top of the electrically conductive diffusion bather layer. The MEMS device further includes a CMOS substrate coupled to the MEMS substrate containing at least one electrode and one or more aluminum pads. The one or more stand-offs is bonded to the one or more aluminum pads utilizing eutectic point between the one or more aluminum pads and the germanium layer.

In a third aspect, a device comprises a first substrate with a MEMS device. The MEMS device includes a silicon movable element and a piezoelectric element such that a strain is induced on the piezoelectric element when an electric potential is applied. The device also includes a second substrate with at least one electronic circuit and electrical connections provided by bonding of the first substrate to the second substrate. The electrical connections from the MEMS device to the electronic circuit provide the electrical potential to the piezoelectric element.

In a further embodiment, a MEMS device is disclosed and described, the MEMS device can comprise a first silicon substrate that can comprise: a handle layer comprising a first surface and a second surface, wherein the second surface can include a cavity; an insulating layer deposited over the second surface of the handle layer; a device layer having a third surface bonded to the insulating layer and a fourth surface; a piezoelectric layer deposited over the fourth surface of the device layer; a metal conductivity layer disposed over the piezoelectric layer; a bond layer disposed over a portion of the metal conductivity layer; and a stand-off formed on the first silicon substrate; wherein the first silicon substrate is bonded to a second silicon substrate, comprising: a metal electrode configured to form an electrical connection between the metal conductivity layer formed on the first silicon substrate and the second silicon substrate.

In accordance with yet a further embodiment, disclosure is made of machine/processor implementable method, comprising: depositing an insulation layer over a handle layer that comprises a first surface and a second surface, wherein the second surface comprises a cavity and the insulation layer is formed on the second surface of the handle layer; bonding a first surface of a device layer to the insulation layer; depositing a piezoelectric layer on a second surface of the device layer; depositing a metal conductivity layer over the piezoelectric layer; partially depositing a bond layer over the metal conductivity layer; forming a stand-off on the second surface of the device layer; and establishing an electrical connection between the metal conductivity layer and a silicon substrate.

In accordance with further aspects and/or embodiments, disclosure also made of a MEMS device, comprising: a first silicon substrate bonded to a second silicon substrate, comprising: an electrode on the second silicon substrate that electrically contacts a conductivity layer disposed on the first silicon substrate; the conductivity layer on the first silicon substrate is disposed over a piezoelectric layer on the first silicon substrate; the piezoelectric layer on the first silicon substrate is deposited over a device layer that comprises a stand-off formed on the first silicon substrate; and the device layer on the first silicon substrate is bonded to an dielectric layer that is deposited over a surface of a handle layer on the first silicon substrate that comprises a cavity.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which:

FIG. 1A illustrates a cross-section view of a MEMS structure in accordance with a first embodiment.

FIGS. 12(a)(i), 12(a)(ii), 12(b)(i), and 12(b)(ii) illustrate cross-section views of a MEMS structure in accordance with a twelfth embodiment.

FIGS. 14A-14C illustrate cross-section views of a MEMS structure in accordance with a fourteenth embodiment

DETAILED DESCRIPTION

Figure 1B:
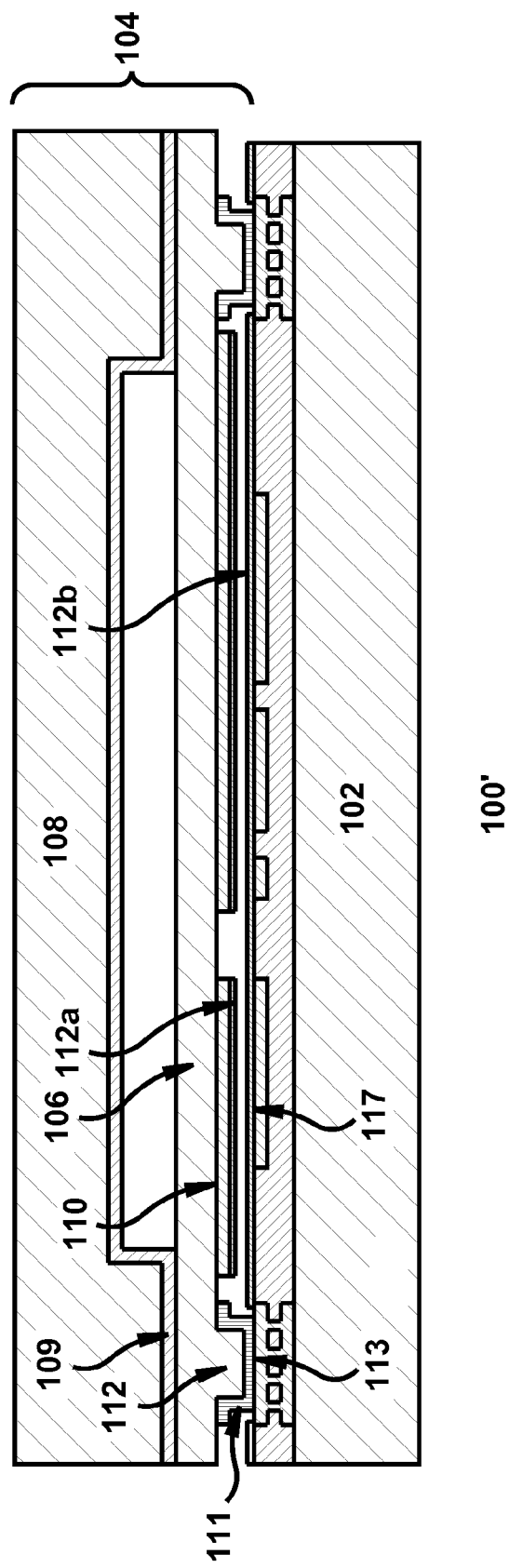
FIG. 1B illustrates a cross-section view of a MEMS structure in accordance with a second embodiment.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The subject disclosure relates to Microelectromechanical System (MEMS) devices, and more particularly, to MEMS devices for Radio Frequency (RF) and low parasitics applications. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown, but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

Additionally, a system and method in accordance with the present invention describes a class of RF MEMS devices, sensors, and actuators including but not limited to switches, resonators and tunable capacitors that are hermetically sealed and bonded to integrated circuits that may use capacitive sensing and electrostatic, magnetic, or piezoelectric actuation.

FIG. 1A illustrates a cross-section view of a MEMS structure 100 in accordance with a first embodiment. FIG. 1A shows a MEMS structure with addition of metal on the silicon structural layer. The structure includes a CMOS wafer 102 bonded to a MEMS wafer 104. The MEMS wafer 104 comprises a silicon device layer 106 fusion bonded to a handle wafer 108 through an oxide layer 109. A MEMS aluminum 110 metal layer is added to the silicon device layer 106. Adding a metal layer lowers the resistivity of the MEMS structure over that of just the silicon device layer 106 making it more attractive for applications requiring low parasitics (ex. RF MEMS, Lorentz force sensors, etc.). In this embodiment, the connection between CMOS wafer 102 and MEMS wafer 104 is created through the silicon standoffs 112 using an aluminum-germanium eutectic bond formed by germanium 111 and aluminum 113. Apart from the stand-offs 112 the bulk of the current is carried by the metal layers 117. In an embodiment, spacers 114 composed of an insulating material such as Silicon Oxide or Silicon Nitride may be placed on bottom metal layer 117 to reduce stiction and control the gap between the top metal layer 110 and the bottom metal layer 117.

FIG. 1B illustrates a cross-section view of a MEMS structure 100' in accordance with a second embodiment. FIG. 1B shows a MEMS structure with additional insulating layer 112a deposited onto the MEMS aluminum 110 and insulating layer 112b deposited onto the bottom electrode 117 to prevent shorting and create a well-defined capacitive gap when the movable MEMS structure consisting of the silicon device layer 106, MEMS aluminum 110, and insulating layer 112a are brought into contact with the electrodes on the CMOS wafer 102.

Figure 2:
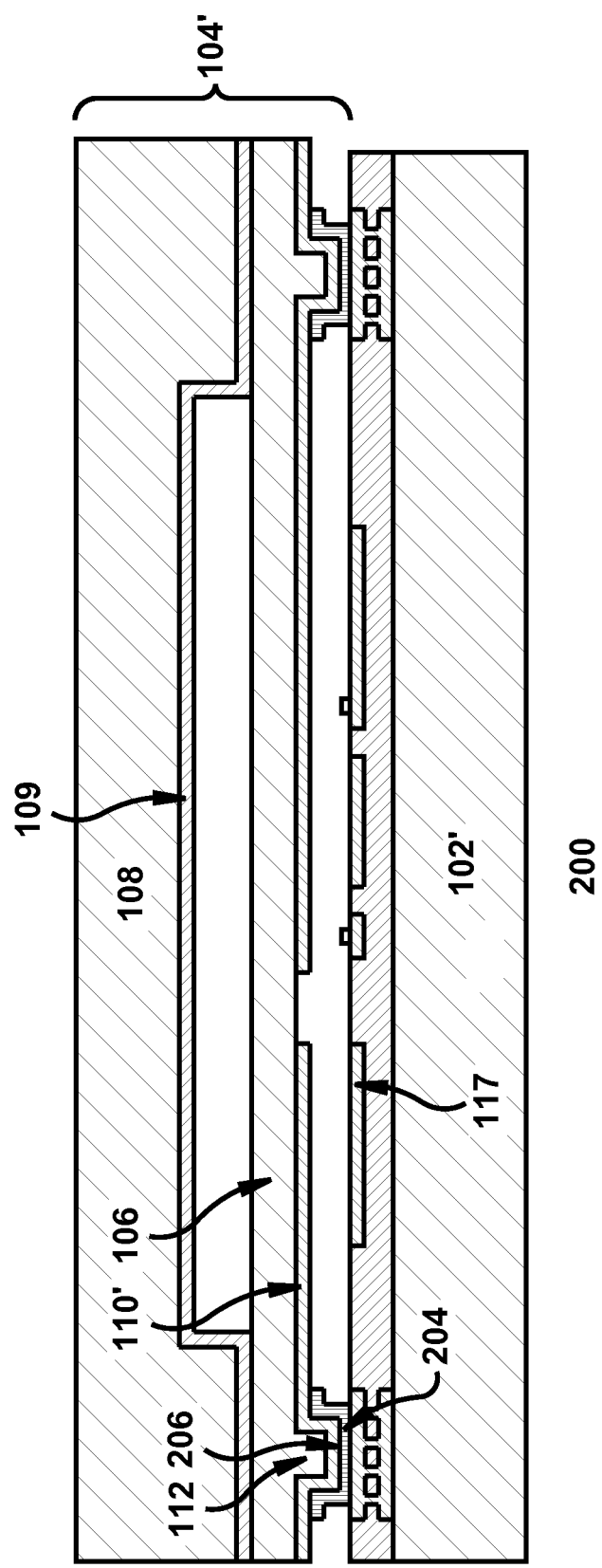
FIG. 2 illustrates a cross-section view of a MEMS structure in accordance with a third embodiment.

FIG. 2 illustrates a cross-section view of a MEMS structure 200 in accordance with a third embodiment. FIG. 2 shows a MEMS structure similar to FIG. 1A. However, in this embodiment the electrical connection between the CMOS wafer 102' and the MEMS wafer 104' occurs through physical contact between the CMOS aluminum 204 on the CMOS wafer 102' and the MEMS aluminum 110' on the MEMS wafer 104' connected by an Aluminum-Germanium layer created by the eutectic reaction between germanium 206 and CMOS aluminum 204 on the CMOS wafer 102' and the MEMS aluminum 110' on the MEMS wafer 104'. One possible risk of this embodiment is a preferential reaction of the germanium 206 with the MEMS aluminum 110' (since that is the layer it is directly deposited on) with a possibly insufficient reaction with the CMOS aluminum 204. The insufficient reaction may lead to poor bonds and marginal electrical connections.

Figure 3:
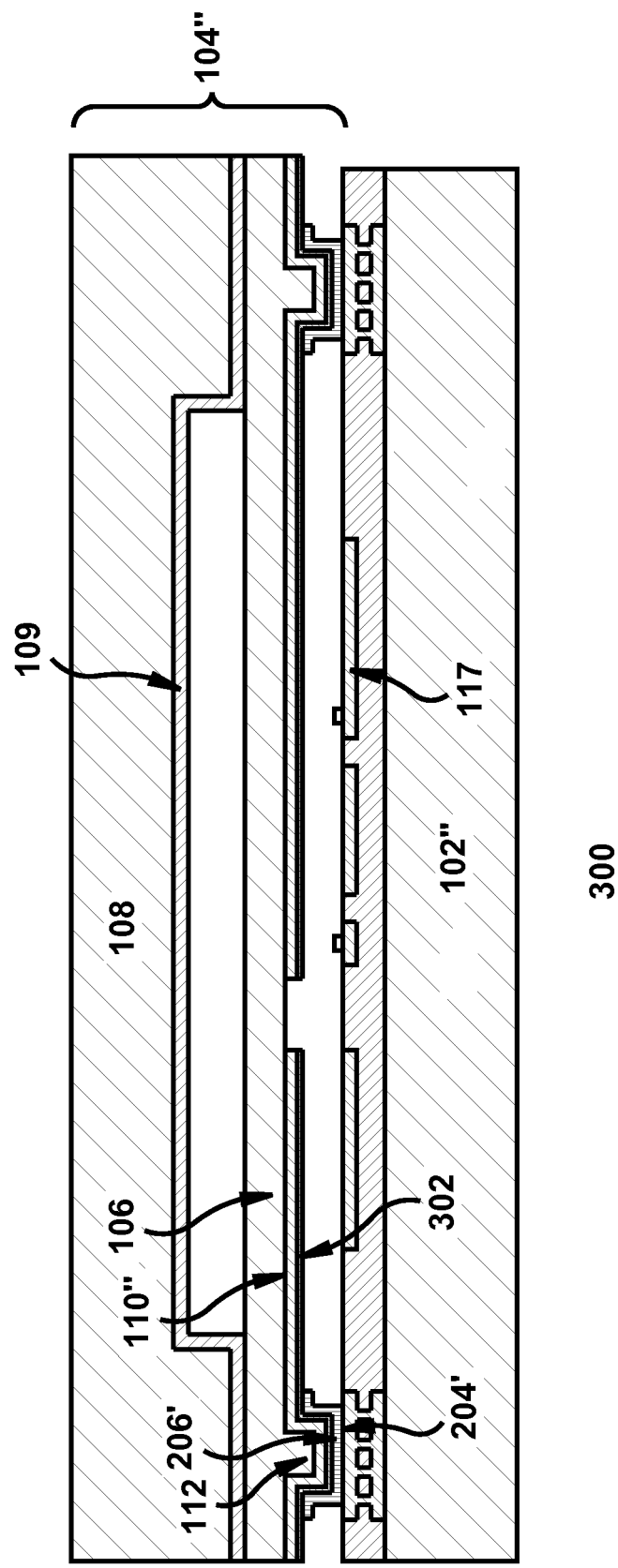
FIG. 3 illustrates a cross-section view of a MEMS structure in accordance with a fourth embodiment.

FIG. 3 illustrates a cross-section view of a MEMS structure 300 in accordance with a fourth embodiment. FIG. 3 shows a MEMS structure identical to FIG. 2 with the exception of a barrier layer 302 deposited between the MEMS aluminum 110" and germanium 206'. The barrier layer 302 is electrically conductive and makes an electrical contact with aluminum upon physical contact. The objective of the barrier layer 302 is to prevent a eutectic reaction between the MEMS aluminum 110" and germanium 206', leaving germanium 206' to eutectically react with the CMOS aluminum 204'. One such barrier layer may be Titanium Nitride. During the eutectic reaction, the CMOS aluminum 204' will mix with germanium 206' creating an electrical contact and physical bond to the barrier layer 302 on the MEMS aluminum 110", thereby creating an electrical contact between the CMOS wafer 102" and MEMS wafer 104".

Figure 4:
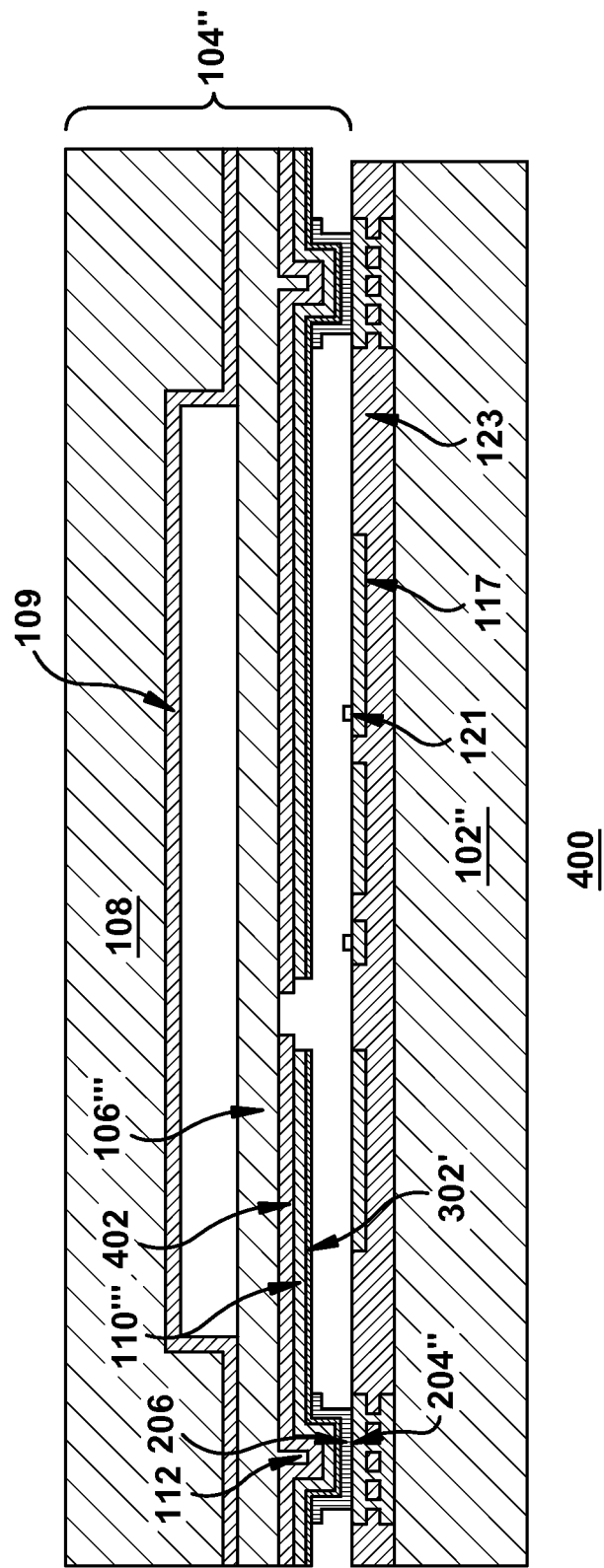
FIG. 4 illustrates a cross-section view of a MEMS structure in accordance with a fifth embodiment.

FIG. 4 illustrates a cross-section view of a MEMS structure 400 in accordance with a fifth embodiment. FIG. 4 shows a MEMS structure identical to FIG. 3, but with an insulating layer 402 deposited between the MEMS aluminum 110''' and silicon device layer 106''' thereby electrically insulating the silicon from the metal. The insulating layer 402 is needed in cases where it is not desirable to carry any electrical signal in the silicon layer (for example in RF applications where signal transmission in the silicon would produce a power loss). In this embodiment, at RF frequencies the MEMS aluminum 110''' is still capacitively coupled to the silicon device layer 106''' through the insulating layer 402. To achieve sufficient isolation the insulating layer must be sufficiently thick to minimize capacitance or the silicon must be sufficiently resistive so as to minimize electrical signal coupling into it.

Figure 5:
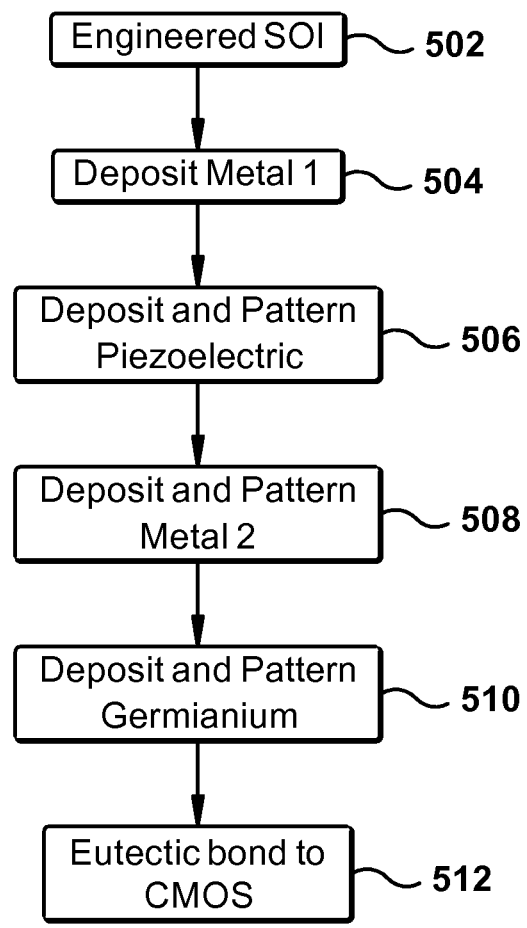
FIG. 5 is a flowchart of a process for adding a piezoelectric layer to a MEMS structure.

FIG. 5 is a flowchart of a process for adding metal and piezoelectric layers to a MEMS structure. The process starts with an Engineered SOI 502. A first metal layer (metal 1) is deposited onto the device silicon surface via step 504 followed by the piezoelectric layer deposition (Ex. Aluminum Nitride or PZT) pattern and etch via step 506. Next a second metal layer (Metal 2) deposited onto the wafer to serve as a top electrode for the piezoelectric layer as well as to provide electrical contact between Metal 1 and the CMOS substrate via step 508. A germanium layer is deposited onto Metal 1 and patterned to define germanium pads in regions where bonding to CMOS will take place via step 510. Next, the MEMS wafer is bonded to a CMOS wafer such that germanium pads eutectically react with aluminum pads on the CMOS creating electrical and physical contact between the CMOS aluminum and MEMS Metal 2 via step 512.

Figure 6:
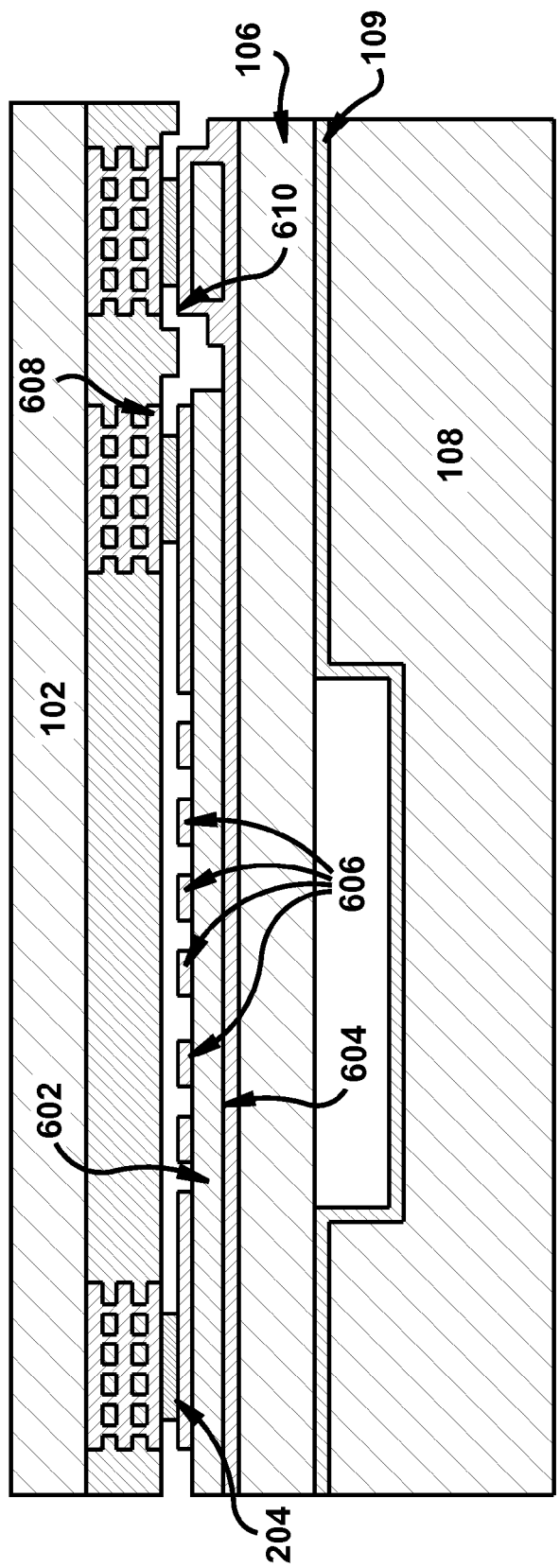
FIG. 6 illustrates a cross-section view of a MEMS structure in accordance with a sixth embodiment.

FIG. 6 illustrates a cross-section view of a MEMS structure 600 in accordance with a sixth embodiment that utilizes a piezoelectric layer. Adding a piezoelectric layer 602 enables a range of applications including acoustic resonators and filters and piezo-actuated devices. To operate, the piezoelectric layer 602 typically requires a bottom electrode 604 and top electrodes 606. The bottom electrode 604 may comprise a first metal layer (metal 1) (Ex. Aluminium, Ruthenium, Tungsten, Molybdenum or Platinum). In another embodiment, a silicon device layer can be used as a bottom electrode 604. The top electrode 606 and interconnect 610 are composed of a second metal layer (metal 2) (Ex. Aluminum). The top electrode 606 and interconnect 610 make physical and electrical contact to the CMOS aluminum pads 608 using an Aluminum Germanium bond. The bottom electrode 604 may make physical and electrical contact to the interconnect 610 thereby connecting to the CMOS wafer. Electrical potentials may be applied between top electrodes 606 and the bottom electrode 604 or between individual top electrodes 606. These potentials create electric fields to induce strains within the piezoelectric material.

Figure 7:
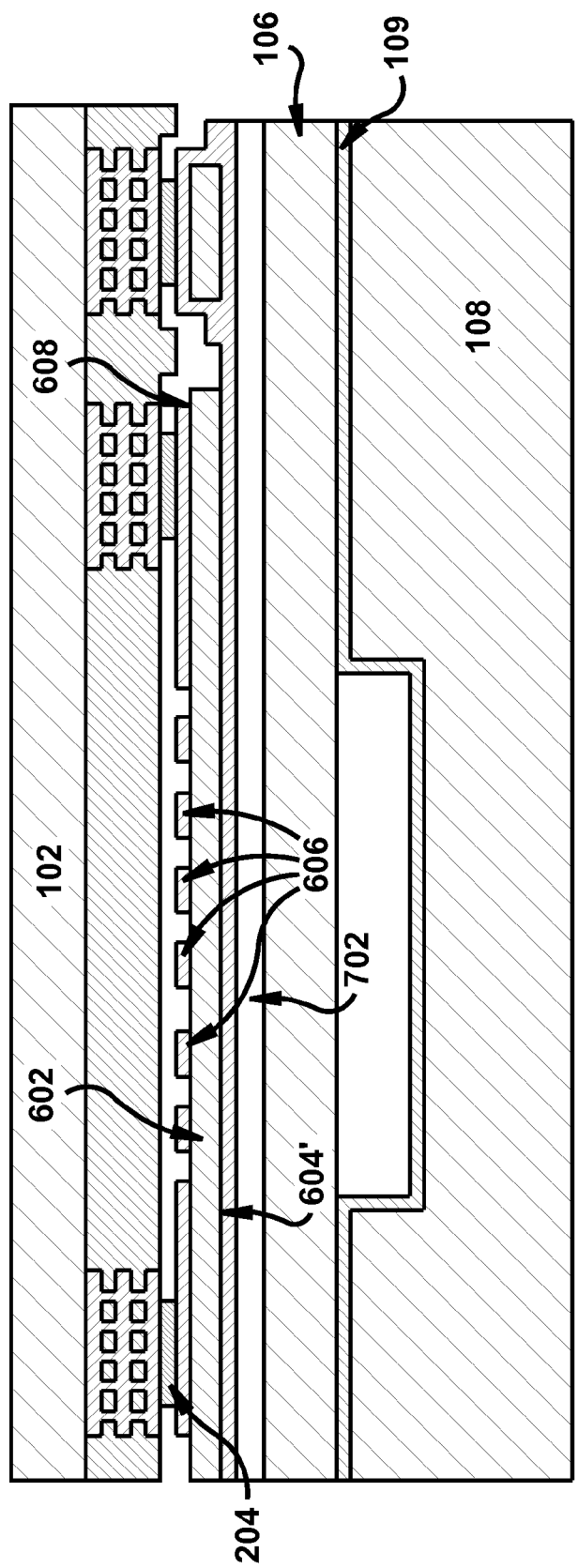
FIG. 7 illustrates a cross-section view of a MEMS structure in accordance with a seventh embodiment.

FIG. 7 illustrates a cross-section view of a MEMS structure 700 in accordance with a seventh embodiment. FIG. 7 shows the same structure as in FIG. 6 with an addition of a silicon dioxide layer 702 between the device layer silicon 106 and metal layer, 604". The silicon dioxide layer, 702 serves as a temperature stabilization layer that improves frequency stability of the resonator or filter over temperature by offsetting the positive Young's modulus temperature coefficient of silicon with the negative Young's modulus temperature coefficient of silicon oxide.

Figure 8:
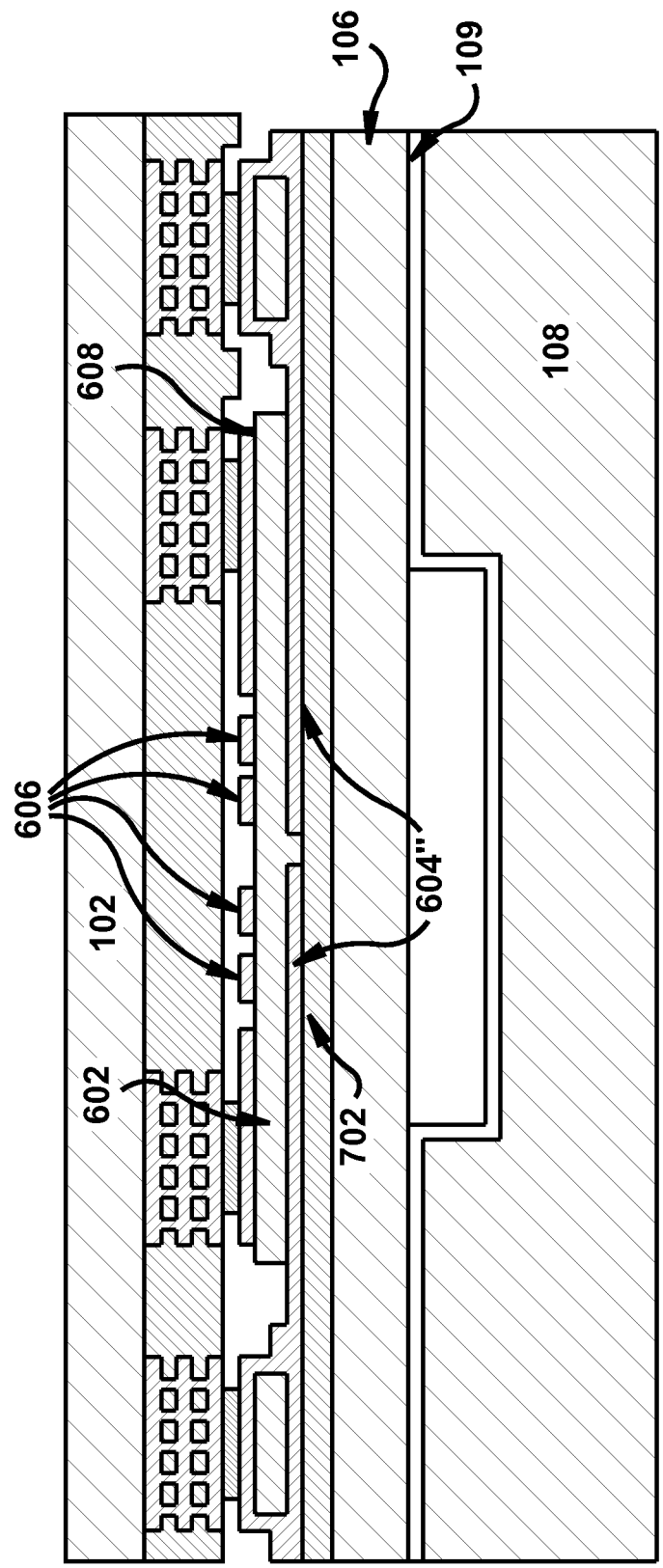
FIG. 8 illustrates a cross-section view of a MEMS structure in accordance with an eighth embodiment.

FIG. 8 illustrates a cross-section view of a MEMS structure 800 in accordance with a eighth embodiment. FIG. 8 shows the same structure as in FIG. 7 with an addition of a patterned bottom electrode 604". By patterning the bottom electrode 604", multiple potentials may be applied to different sections of the bottom surface of the piezoelectric material 602, leading to more design flexibility and potentially more efficient devices. For resonator applications, for example, the ability to input electrical signals on both the bottom and top of the piezoelectric structure can lead to higher coupling efficiency. In further embodiments, the subject application provides disclosure of a micro-electro-mechanical system (MEMS) integration flow to incorporate aluminum nitride (AlN) on an engineering substrate and a top electrode layer combined with aluminum germanium (AlGe) with complementary metal-oxide-semiconductor (CMOS) wafers/layers/substrates.

In addition to the foregoing, the subject application further describes a MEMS integration flow that comprises starting wafers/layers/substrates (e.g., complementary metal-oxide-semiconductor (CMOS) wafers/layers/substrates, MEMS handle wafers/layers/substrates, and/or MEMS device wafers/layers//substrates) and a plurality of masking layers, for example, ten masking layers, though, as will be appreciated by those of ordinary skill, a fewer or a greater number of masking layers can be utilized without unduly departing from the generality and scope of the subject disclosure.

Typically, the MEMS handle wafers/layers/substrates can be patterned with back-side alignment mark layers used for front-to-back alignment after fusion bonding. Cavities that define suspended MEMS structures can also be etched in a front-side of the MEMS handle wafers/layers/substrates.

The MEMS handle layers/wafers/substrates can then be oxidized and fusion-bonded to MEMS device layers/wafers/substrates.

The MEMS device layers/wafers/substrates can, for example, comprise silicon (Si) structural layers that can be ground and polished to target thicknesses, at which point aluminum nitride seed layers can be disposed over a surface of the silicon structural layers, molybdenum layers can be deposited over the aluminum nitride seed layers, aluminum nitride stacking layers can be deposited over the molybdenum layers, and/or silicon dioxide standoff layers can be disposed on the aluminum nitride stacking layers.

The silicon dioxide standoff layers can be etched on the MEMS device layers/wafers/substrates to provide separations between the MEMS structures and the complementary metal-oxide-semiconductor wafers/layers/substrates. The aluminum nitride (AlN) stacking layers can then be patterned through a silicon dioxide hard mask with structures, bottom contacts, and/or aluminum nitride top contact masks. Additionally, aluminum, titanium, and germanium can then be deposited in sequence from bottom to top and patterned with germanium pads and electrodes. The silicon device layer can then be patterned and etched using, for instance an anisotropic etch process used to create deep penetration, steep-sided holes and trenches in layers/wafers/substrates, typically with high aspect ratios, such as deep reactive-ion etching (DRIE), to define release structures. Generally, the combination of the structures and release layers that define the fully released structure are formed on the upper cavity.

A bottom cavity can be etched in the complementary metal-oxide-semiconductor layer/wafer to allow clearance for out-of-plane moving of the MEMS structures (e.g., combinations of silicon and aluminum nitride stacking layers) or damping control. The MEMS and complementary metal-oxide-semiconductor wafers/layers/substrates can then be bonded using aluminum-germanium (Al—Ge) eutectic bonding to create hermetic seals around the MEMS structures as well as electrical interconnects between the MEMS structures and complementary metal-oxide-semiconductor circuits. Thereafter, the bonded wafer/layer can be thinned on the MEMS side to a desired thickness and a port can be formed on the polished side of the MEMS wafer/layer to create access to the surrounding environment. Silicon tabs on the MEMS wafer/layer can thereafter be removed using, for example, a dicing process to expose the complementary metal-oxide-semiconductor wire-bond pads.

Figure 9A:
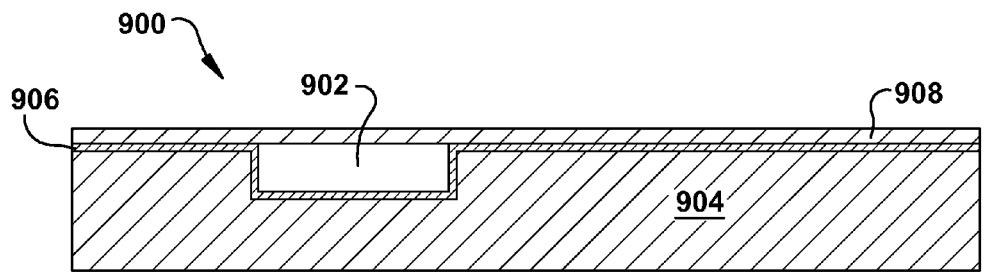
FIGS. 9A-9K illustrate cross-section views of a MEMS structure in accordance with a ninth embodiment.

In accordance with the foregoing and with reference to FIG. 9A, a cross-section of a MEMS device 900 is illustrated. The MEMS 900 can comprise a handle wafer/layer/substrate 904 that can have been patterned with back-side alignment mark layers to be employed for front-to-back alignment after fusion bonding. Further, a front side of handle wafer/layer/substrate 904 can have been etched to form cavities 902. As depicted handle wafer/layer/substrate 904 can be formed of a silicon layer/substrate into which cavities 902 can have been etched. To the handle wafer/layer/substrate 904 inclusive of cavities 902 a silicon dioxide layer/substrate 906 can be deposited on the silicon layer/substrate 904 thereby overlaying silicon layer/substrate 904 and cavities 902 formed therein. Disposed and/or deposited over silicon dioxide layer/substrate 906 and fusion bonded to the silicon dioxide layer/substrate 906 can be a substrate/layer formed of silicon 908. In accordance with an embodiment, the handle wafer/layer/substrate 904 inclusive of formed cavities 902 and silicon dioxide layer 906 can be referred to as an engineered substrate, and for purposes of this disclosure can be referred to a the MEMS handle layer.

Figure 9B:
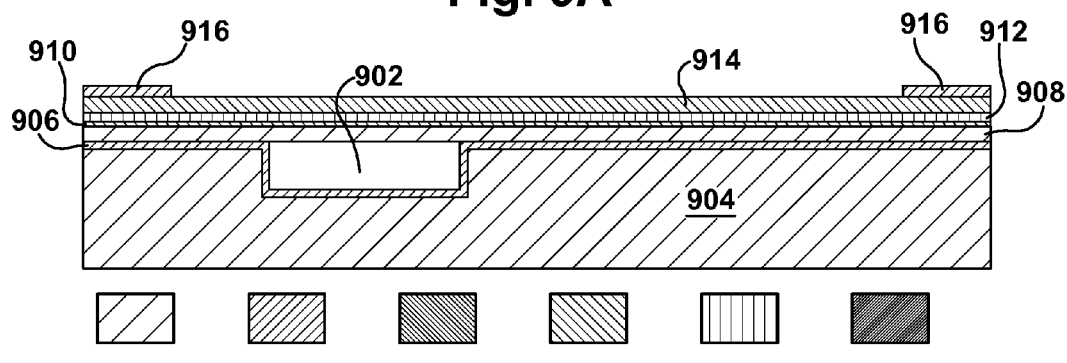

With reference to FIG. 9B that depicts a further cross-sectional view of MEMS device 900, in addition to the above noted silicon layer/substrate 904 inclusive of etched cavities 902, silicon dioxide layer/substrate 906 (silicon layer/substrate 904 inclusive of etched cavities 902 and silicon dioxide layer/substrate 906 can form and be referred to as the MEMS handle layer/wafer/substrate), and a substrate/layer 908 formed of silicon, silicon dioxide standoffs 916 can be formed on the MEMS handle layer/wafer/substrate by, for example, successively depositing aluminum nitride seed layers 910, molybdenum layers 912, and aluminum nitride stacking layers 914 over silicon substrate/layer 908, prior to etching and/or forming silicon dioxide standoffs 916. The additional deposited or disposed layers comprising the aluminum nitride seed layers 910, molybdenum layers 912, aluminum nitride stacking layers 914, and silicon dioxide standoffs 916 over silicon substrate/layer 908 can be referred to the MEMS device layer/wafer/substrate and/or piezoelectric layer/wafer/substrate.

Silicon substrate layer 908 can be the silicon structural layer of the MEMS device layer to which the MEMS handle layer (e.g., silicon layer/substrate 904 inclusive of etched cavities 902 and silicon dioxide layer/substrate 906) can have been fusion bonded to the MEMS device layer/wafer/substrate (e.g., silicon structural substrate/layer 908, aluminum nitride seed layers 910, molybdenum layers 912, aluminum nitride stacking layers 914, and standoffs 916). It should be noted that the MEMS handle layer, prior to fusion bonding of the MEMS handle layer to the MEMS device layer, can typically have been oxidized and the silicon structural layer/substrate 908 of the MEMS device layer can have been ground and polished to a target or defined thickness prior to deposition of the aluminum nitride seed layers 910, molybdenum layers 912, aluminum nitride stacking layers 914, and standoffs 916 formed of silicon dioxide. Standoffs 916 are typically formed on the MEMS device layer to provide separation between the MEMS structure and a CMOS wafer/layer/substrate.

Figure 9C:
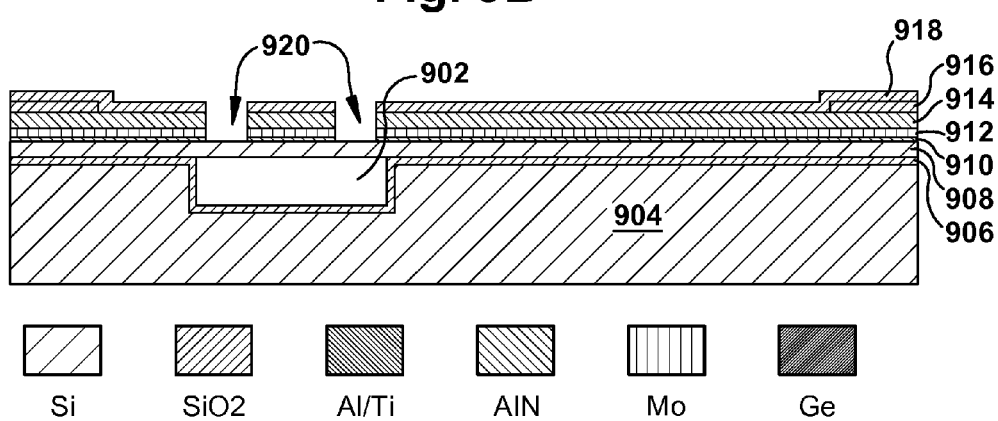
Figure 9D:
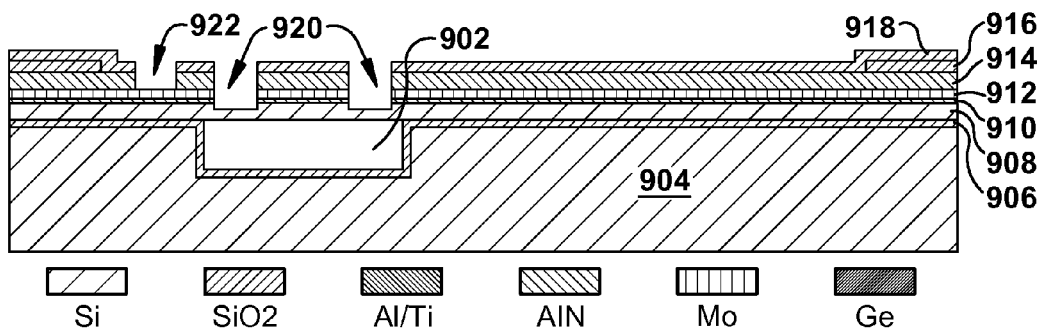
Figure 9E:
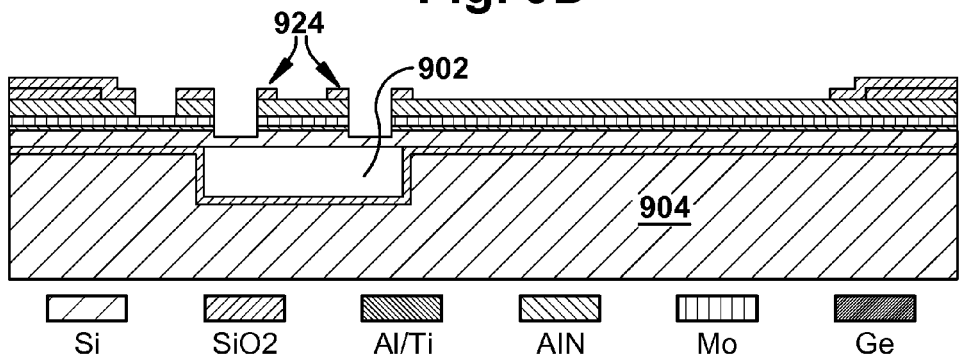

FIGS. 9C-9E provide illustration of a further cross-sectional view of MEMS device 900 including the layers described above in connection with FIGS. 9A-9B. In FIG. 9C, structure can be defined and separate bottom electrodes 920 can be carved out by first disposing or depositing a silicon dioxide hard mask 918 over the aluminum nitride stacking layers 914 and standoffs 916 and thereafter etching through silicon dioxide hard mask 918 to define the structure and carve out separate bottom electrodes 920. As will be observed, the etching process etches through layers/substrates respectively formed of silicon dioxide hard mask 918, aluminum nitride 914, molybdenum 912, and aluminum nitride seed layer 910, to the silicon structural layer/substrate 908. In FIG. 9D, a bottom electrodes contact 922 can be created. In FIG. 9E a opening etch on silicon dioxide layer 918 can be performed to define aluminum nitride top contacts 924 and avoids unnecessary HBAR resonance from the pad. Defining the structure and carving out the bottom electrodes 920, creating bottom electrode contacts 922, and defining aluminum nitride top contacts 924, as depicted in FIGS. 9C-9E, can be undertaken by patterning the aluminum nitride stacking layers through silicon dioxide hard mark 918.

Figure 9F:
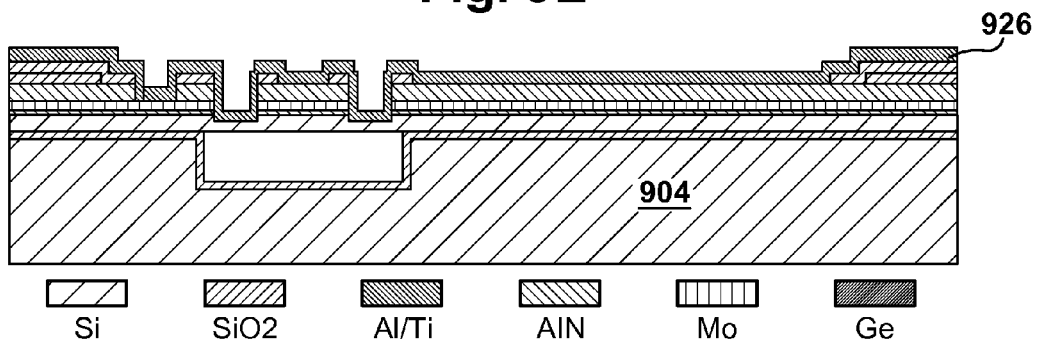
Figure 9G:
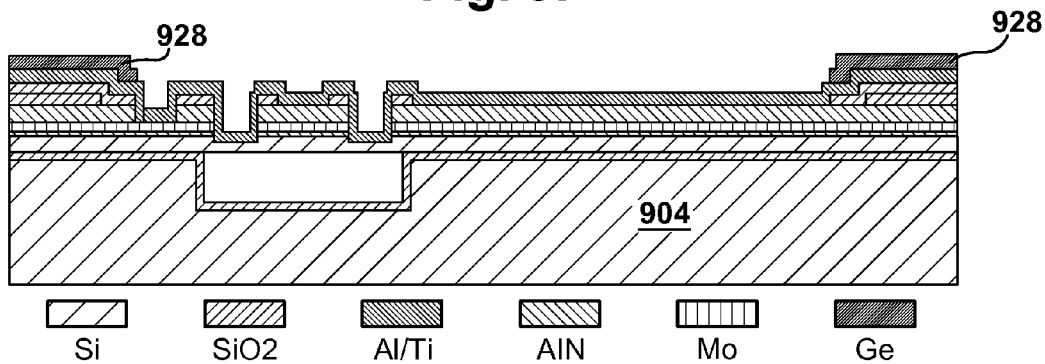
Figure 9H:
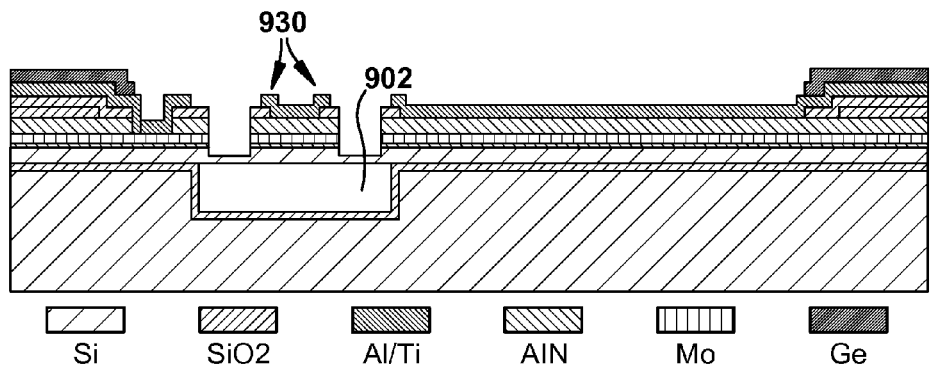
Figure 9I:
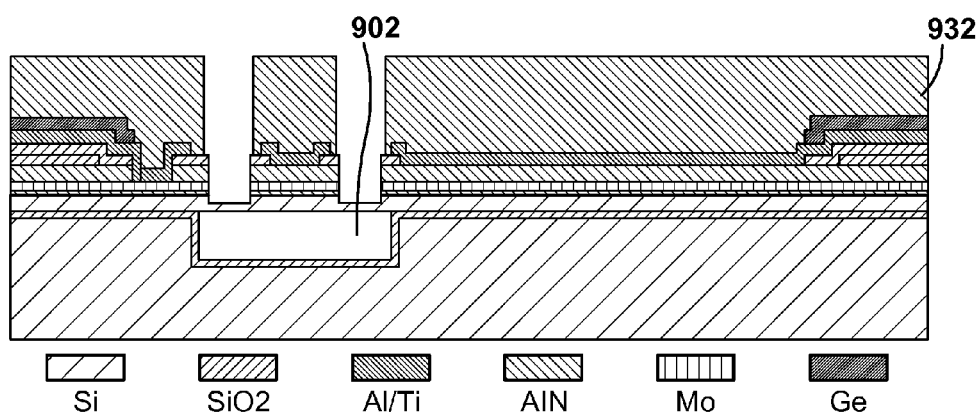

As illustrated in FIG. 9F aluminum and titanium layers 926 are deposited for the purposes of top electrode material deposition and then germanium layers 928 are deposited over the aluminum and titanium layers 926 so that germanium pads 928 and electrodes 930 can be patterned as depicted in FIGS. 9G-H. The device layer can be overlaid with a layer of photo-resist 932 and patterned and etched using deep reactive-ion etching (DRIE) to define release structures, as depicted in FIG. 9I. Only the combination of the structure and release layer can define the fully released structure 934 (See FIG. 9J) in the cavity 902.

Figure 9J:
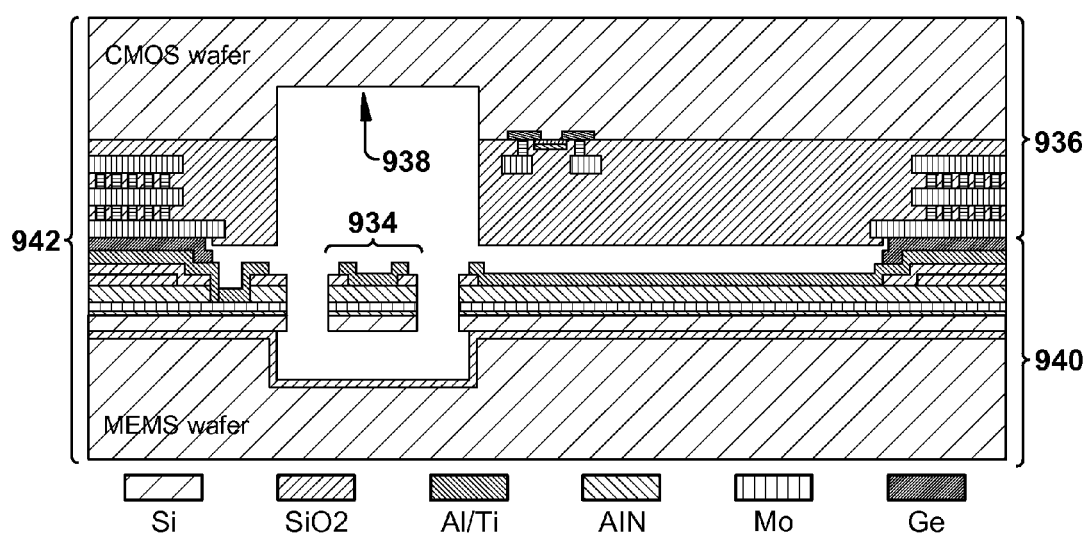
Figure 9K:
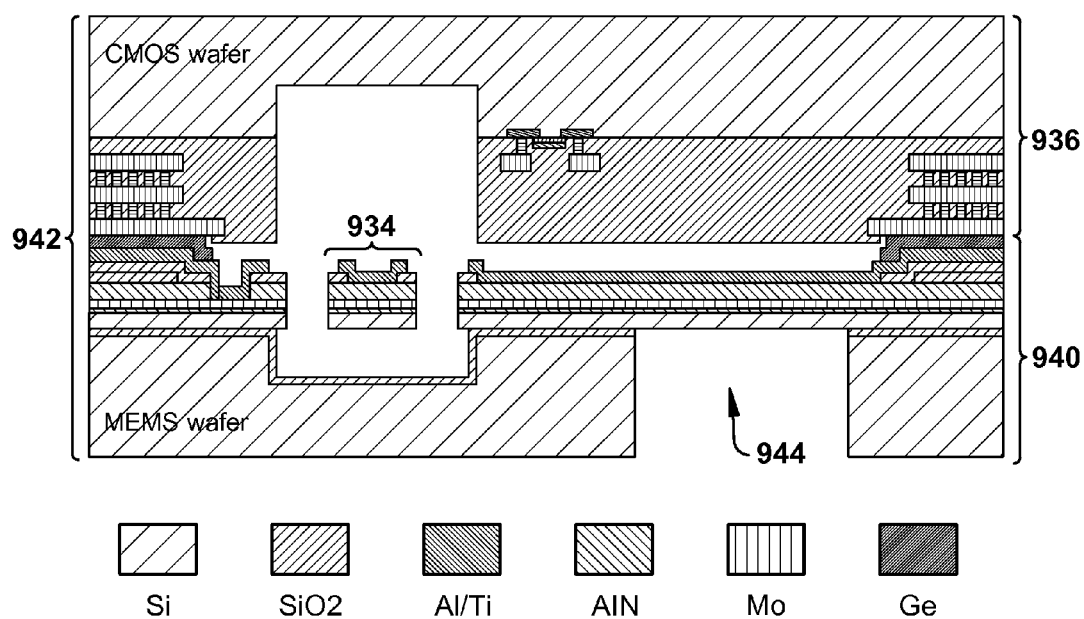

As depicted in FIG. 9J, a cavity 938 is etched into a CMOS wafer 936 to allow clearance for out-of-plane moving MEMS structures 934 and/or damping control, and thereafter the CMOS wafer 936 and MEMS device wafer 940 are bonded using an Aluminum-Germanium eutectic bond to create a hermetic seal around MEMS structure 934 and CMOS circuits and form a bonded wafer 942. The eutectically bonded wafer 942 can then be thinned, for instance, on the MEMS wafer side, to a defined or desired thickness and a port 944 can be formed on a polished side of the MEMS wafer 942 to create access to the surrounding environment, as illustrated in FIG. 9K. Additionally, silicon tabs on the MEMS wafer 942 can be removed using a dicing process to expose CMOS wire bond pads.

Figure 10:
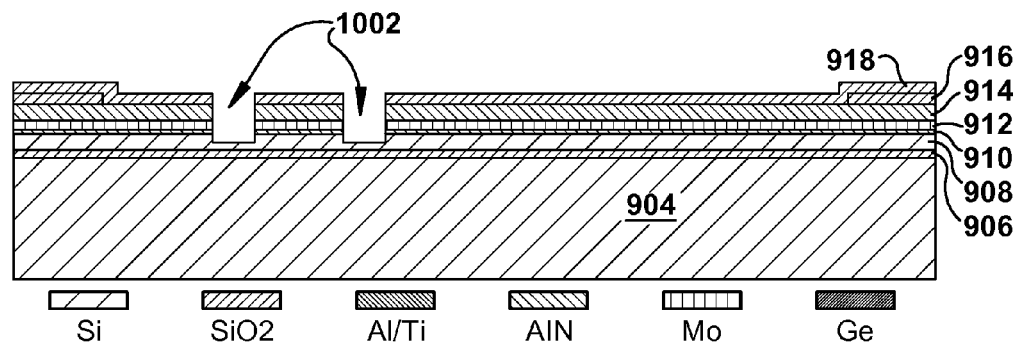
FIG. 10 illustrates a cross-section view of a MEMS structure in accordance with a tenth embodiment.

In accordance with the foregoing and in an additional embodiment as illustrated in FIG. 10, subsequent to defining structure and carving out separate bottom electrodes 920, as illustrated in FIG. 9C, but prior to creating bottom electrode contacts 922, as depicted in FIG. 9D, a partial silicon etch can be performed wherein structural silicon layer 908 (e.g., the structural silicon layer of the MEMS device wafer) can partially be further etched 1002. The partial etch 1002 can be performed to partially thin down the silicon device layer (e.g., structural silicon layer 908). The partial etch 1002 can be accomplished with a structure layer mask through silicon etch or silicon deep reactive-ion etching. It should be noted that the partial etch 1002 can be an additional etch to that previously performed to define structure and carve out separate bottom electrodes 920 as elucidated above in connection with FIG. 9C. Additionally and/or alternatively, partial etch 1002 and the etch performed to define structure and carve out separate bottom electrodes 920, as depicted in FIG. 9C, can be accomplished in a single act without unduly and/or unnecessarily departing from the intent and generality of the subject disclosure.

Figure 11:
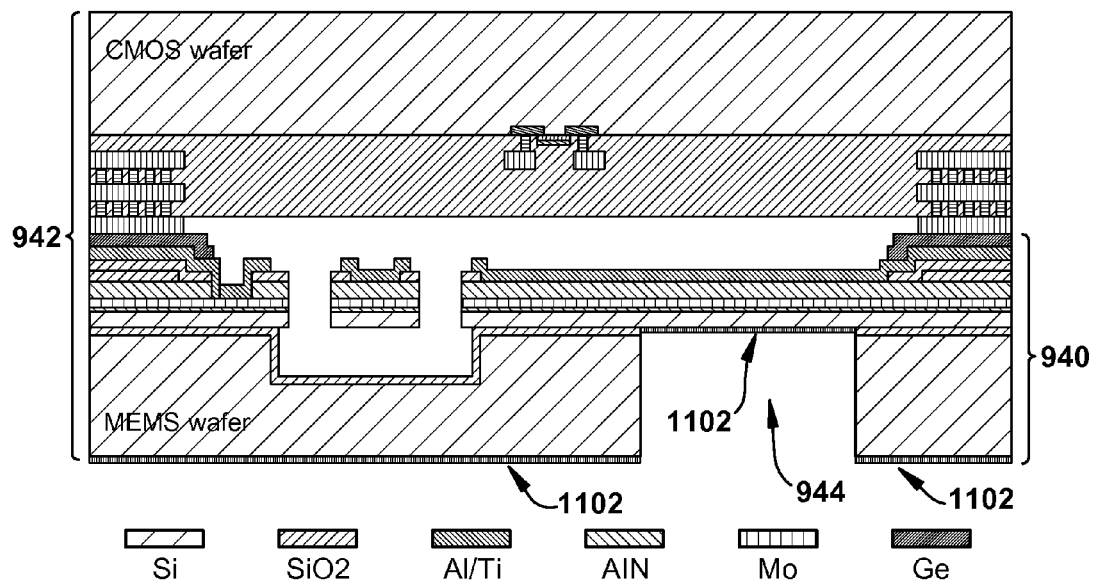
FIG. 11 illustrates a cross-section view of a MEMS structure in accordance with a eleventh embodiment.

In a further additional aspect or embodiment, as illustrated in FIG. 11, an additional act of can be performed subsequent to etching port 944 on a polished side of the MEMS wafer 942 (see e.g., FIG. 9K). In accordance with this aspect, an infra-red (IR) absorption layer 1102 can be deposited on the back of the MEMS handle wafer 940. The infra-red (IR) absorption layer 1102, as illustrated, can be disposed not only on the back of the MEMS handle wafer 940 but also in the previously etched port 944.

In accordance with a further disclosed aspect or embodiment, as illustrated in FIG. 12 additional and/or alternative standoff 916 formations techniques can be employed. As illustrated in FIG. 12(a)(i) a layer of silicon 908 can be deposited over the MEMS handle layer/wafer/substrate (e.g., silicon layer/wafer/substrate 904 inclusive of cavities 902 and silicon dioxide layer/substrate 906) and thereafter the deposited layer of silicon 908 can be partially etched to form standoffs 916, thus, referring back to FIG. 9A and as illustrated in FIG. 12(a)(i), standoffs 916 can have been formed from the structural silicon layer 908 of the MEMS device layer or piezoelectric layer/wafer/substrate. Alternatively, as depicted in FIG. 12(a)(ii) rather than partially etching into structural silicon layer 908, structural silicon layer 908 can be overlaid with a silicon dioxide layer and thereafter the deposited silicon dioxide layer can be patterned to create or form standoffs 916, as illustrated in FIG. 12(a)(ii).

Thereafter, and still with reference to FIG. 12, deposition of piezoelectric stacking layers 1202, as described and illustrated in connection with FIGS. 9C-9K, can be carried out as respectively depicted in FIGS. 12(b)(i) and 12(b)(ii). In the context of FIG. 12(b)(i) it will be observed that the subsequent piezoelectric stacking layers 1202, as described in relation to FIGS. 9C-9K, overlay silicon standoffs 916, whereas, in connection with FIG. 12(b)(ii), the successive layers that comprise the piezoelectric stacking layers 1202, as disclosed with respect to FIGS. 9C-9K, are deposited over silicon dioxide standoffs 916.

FIG. 13 illustrates an additional and/or alternative process flow than that described and disclosed in connection with FIGS. 9A-9K. In this instance, and as depicted in FIG. 13(a), and as has been described above in relation to FIG. 12(a)(i), silicon standoffs 916 can have been formed by patterning and/or partially etching structural silicon layer 908. Thereafter, the piezoelectric layer stacking (e.g., aluminum nitride seed layers 910, molybdenum layer 912, and aluminum nitride stacking layer 914) described earlier with respect to FIG. 9B can be reduced to only an aluminum nitride layer 1302, wherein an aluminum nitride layer 1302 is overlaid and patterned 1304 on top of the structural silicon layer 908 inclusive of the formed silicon standoffs 916. As illustrated in FIGS. 13B-13H, the structural silicon layer 908 inclusive of the silicon standoffs 916 can be used as bottom electrodes. In FIG. 13C the aluminum nitride layer 1302 can be overlaid with aluminum and titanium layers 1306. As will be noted in relation to FIG. 13C, patterning in aluminum nitride layer 1302 at 1304 will be filled by the aluminum and titanium layers 1306.

Figure 13A:
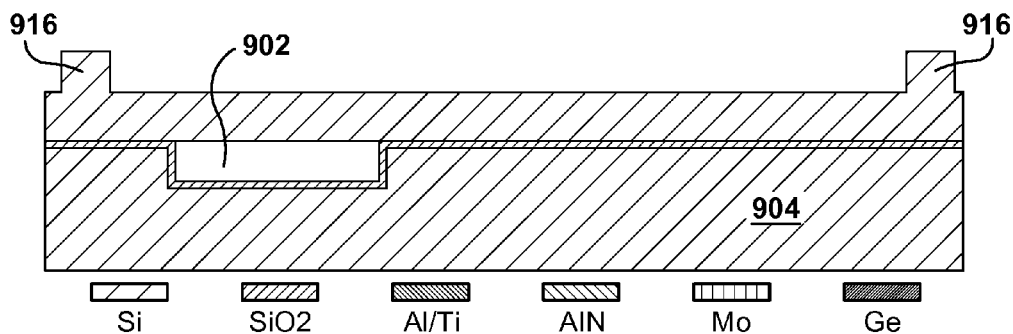
FIGS. 13A-13H illustrate cross-section views of a MEMS structure in accordance with a thirteenth embodiment.
Figure 13B:
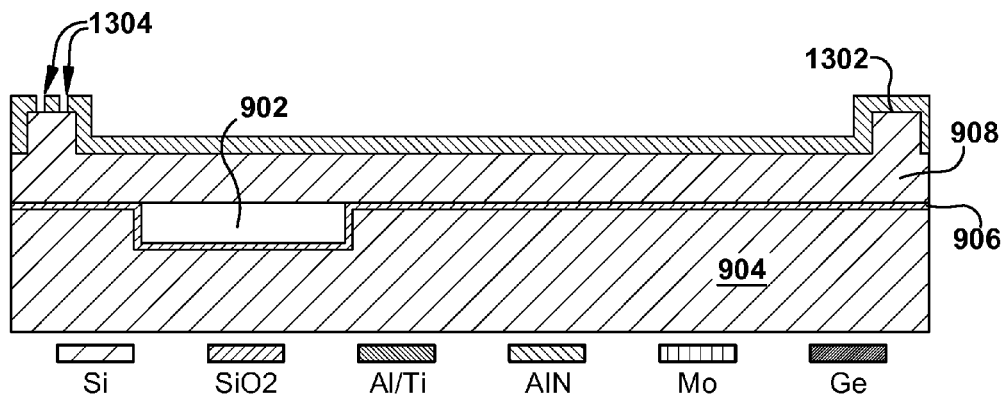
Figure 13C:
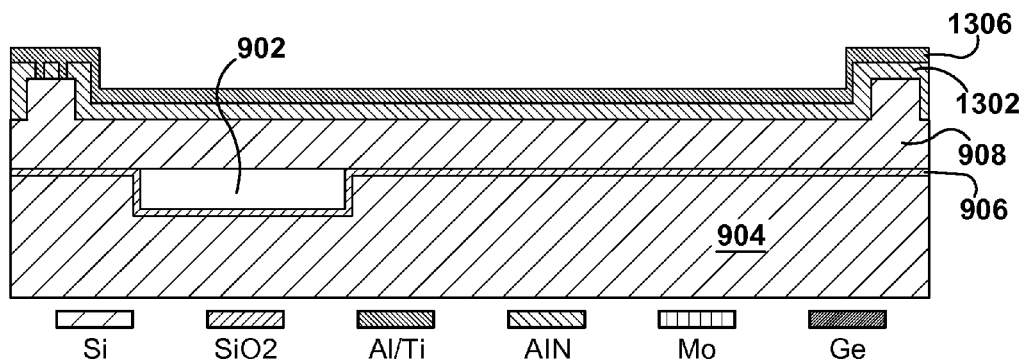
Figure 13D:
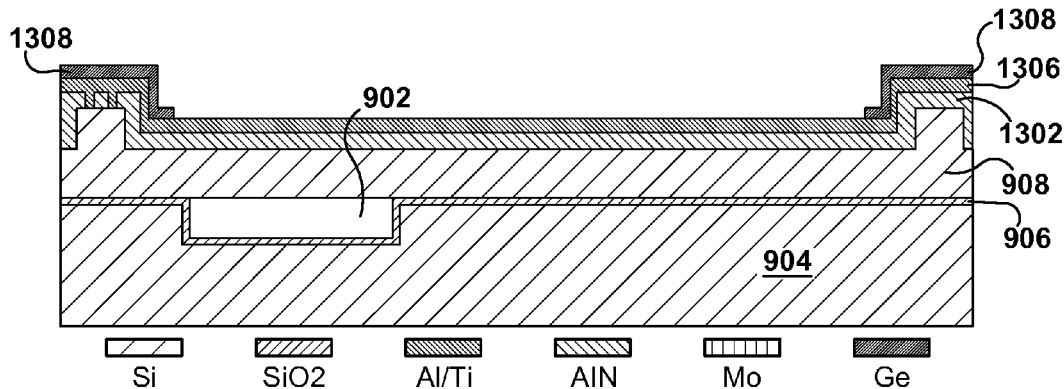
Figure 13E:
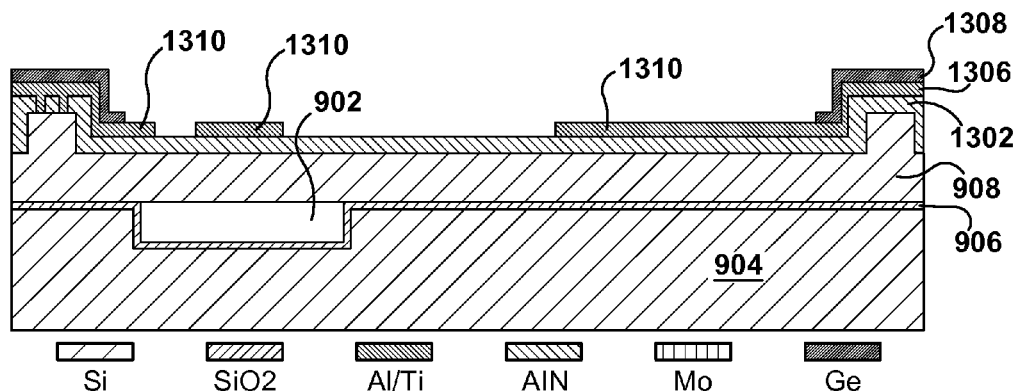
Figure 13F:
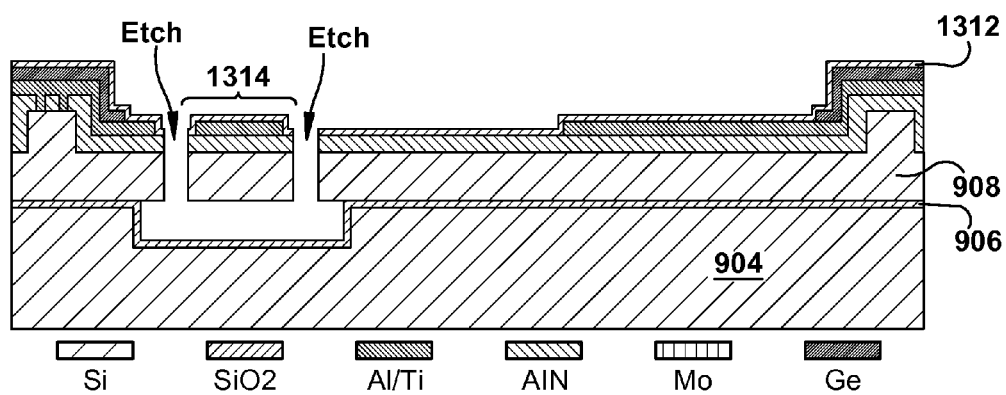

In FIG. 13D germanium pads 1308 can be defined, wherein a germanium layer can be overlaid aluminum and titanium layers 1306 to form the germanium pads 1308. Further, in FIG. 13E the previously deposited aluminum and titanium layers 1306 can be selectively patterned to define aluminum and titanium pads 1310 and to expose the underlying aluminum nitride layer 1302. In FIG. 13F a silicon dioxide hard mask 1312 can be deposited over defined germanium pads 1308, aluminum and titanium pads 1310, and exposed aluminum nitride layer 1302 and an etch or patterning performed to define the structure 1314.

Figure 13G:
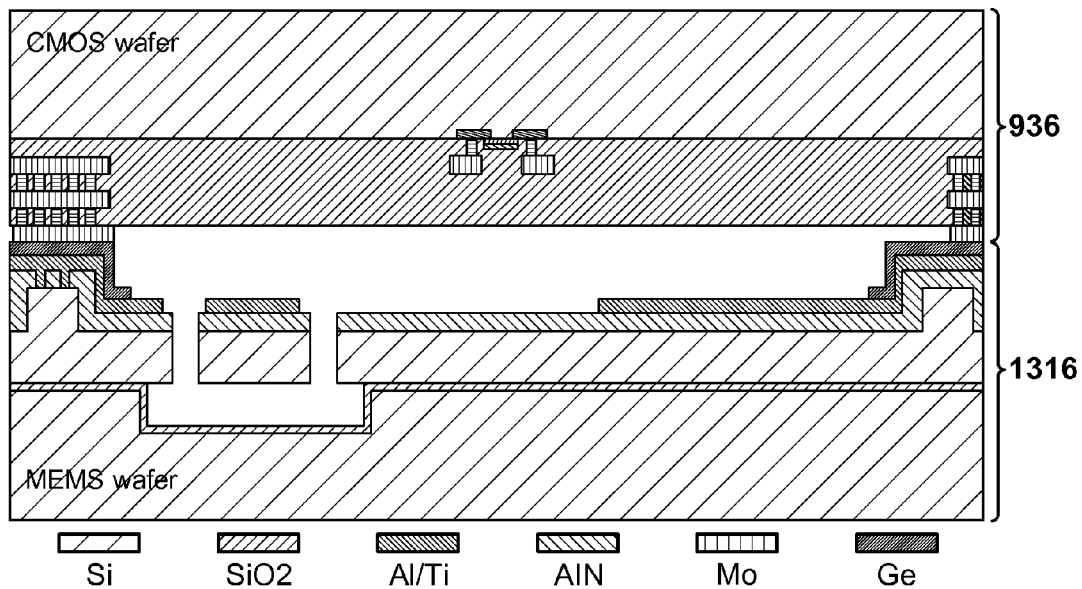
Figure 13H:
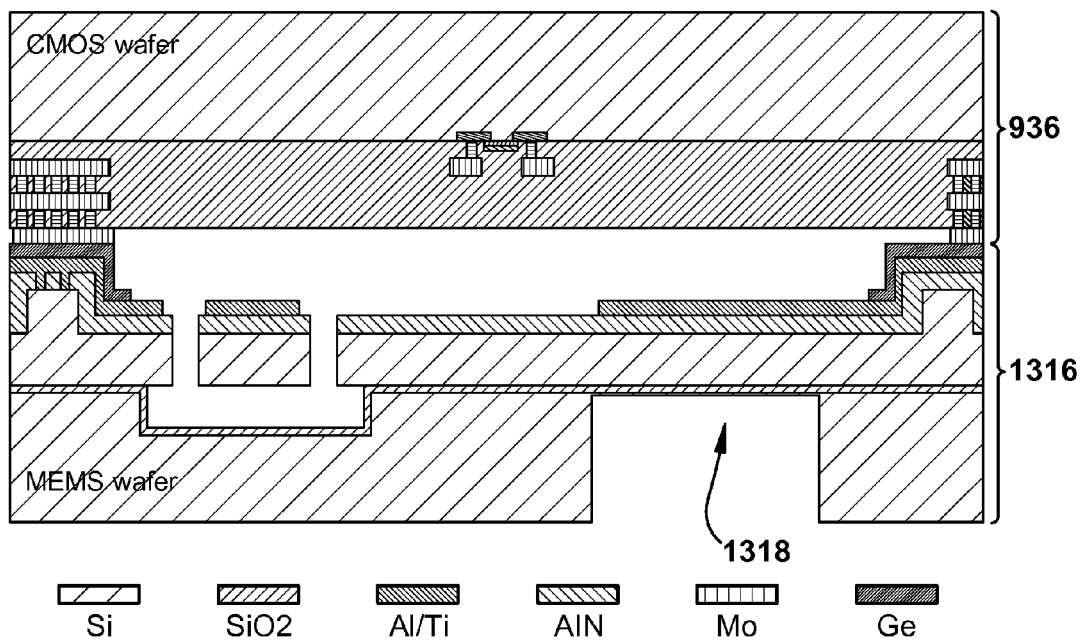

Once structure 1314 has been defined, a CMOS wafer 936 can be eutectically bonded to the MEMS device wafer 1316, in a manner similar to that described in the context of FIG. 9J and illustrated in FIG. 13G. Further, on completion of the eutectic bonding of the CMOS wafer 936 to the MEMS device wafer 1316, a port 1318 can be formed on a polished side or surface of the MEMS device wafer 1316, as illustrated in FIG. 13H.

Figure 14C:
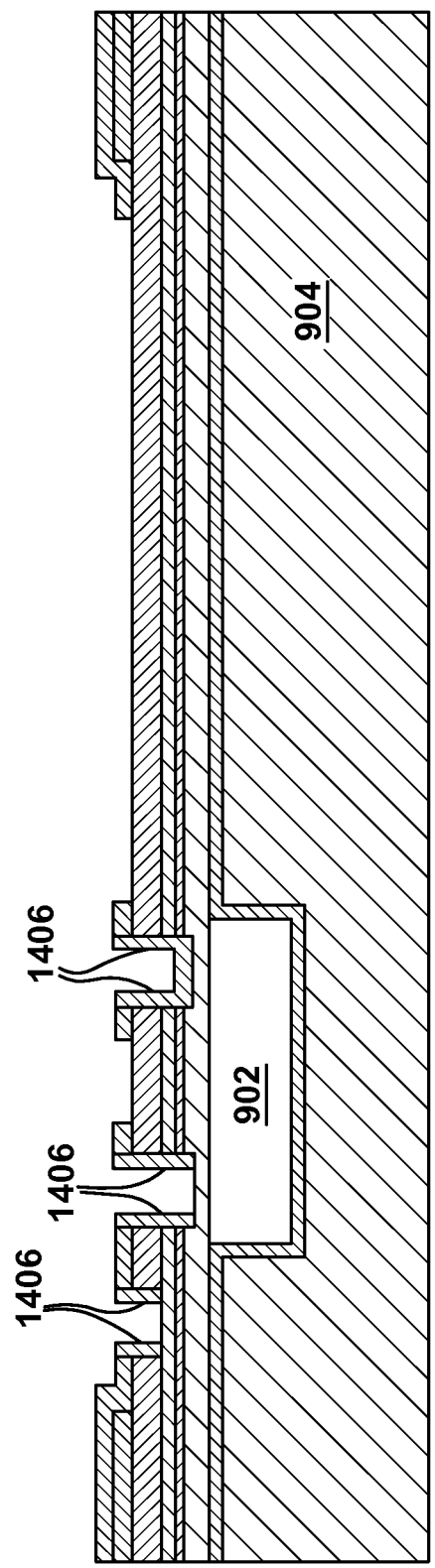

With reference now to FIGS. 14A-14C, and initially in reference to FIG. 14A, in order to provide protection to sidewalls 1402 during the various etching and/or patterning phases that can be employed to construct the described micro-electrical-mechanical device, in accordance with an embodiment, and as illustrated in FIG. 14B a silicon dioxide layer 1404 can be deposited to overlay the layers previously described in the context of FIG. 9E. It will be observed on examination of FIG. 14B that the silicon dioxide layer 1404 has been disposed to cover the sidewalls 1402 as well as bottom electrodes 920 and the bottom electrodes contact 922. Additionally, as will also have been observed on inspection of FIG. 14B, the deposited silicon dioxide layer 1404 will also have covered the aluminum nitride top contact 924. The deposition and patterning of silicon dioxide layer 1404 provides isolation Once the silicon dioxide layer 1404 has been deposited as illustrated in FIG. 14B, the silicon dioxide layer 1404 can undergo a blank reactive-ion etch to create sidewall protection 1406.

In accordance with the foregoing, the subject application discloses in one or more various embodiments and aspects a MEMS device, comprising: a first silicon substrate comprising: a handle layer comprising a first surface and a second surface, the second surface comprises a cavity; an insulating layer deposited over the second surface of the handle layer; a device layer having a third surface bonded to the insulating layer and a fourth surface; a piezoelectric layer deposited over the fourth surface of the device layer; a metal conductivity layer disposed over the piezoelectric layer; a bond layer disposed over a portion of the metal conductivity layer; and a stand-off formed on the first silicon substrate; wherein the first silicon substrate is bonded to a second silicon substrate, comprising: a metal electrode configured to form an electrical connection between the metal conductivity layer formed on the first silicon substrate and the second silicon substrate.

In accordance with the foregoing, the stand-off can be formed on the piezoelectric layer and can be formed as a silicon layer or as a silicon dioxide layer deposited on the device layer. Additionally and/or alternatively, the stand-off can be formed of silicon dioxide deposited on the piezoelectric layer.

Further, the piezoelectric layer can be patterned and etched to form a sidewall in the piezoelectric layer, wherein a first dielectric layer can be interposed between the piezoelectric layer and the metal conductive layer, and a second dielectric layer can be disposed on the sidewall of the piezoelectric layer. In addition, an opening in the handle layer can be exploited to expose the device layer, an orifice in the device layer can be used to expose the piezoelectric layer, and the device layer can include an aperture.

In accordance with a disclosed aspect the device layer can be selectively or partially removed, the piezoelectric layer can in an embodiment comprise aluminum nitride or in another embodiment can comprise: an aluminum nitride (AlN) seed layer, a bottom metal layer, and an aluminum nitride (AlN) layer. Further, an infra-red (IR) absorption layer can be deposited on a portion of the device layer and/or the infra-red (IR) absorption layer can be deposited on a portion of the piezoelectric layer.

In accordance with a further embodiment, a method is described and disclosed. The method can comprise a sequence of machine executable operations that can include depositing an insulation layer over a handle layer that comprises a first surface and a second surface, wherein the second surface comprises a cavity and the insulation layer is formed on the second surface of the handle layer; bonding a first surface of a device layer to the insulation layer; depositing a piezoelectric layer on a second surface of the device layer; depositing a metal conductivity layer over the piezoelectric layer; partially depositing a bond layer over the metal conductivity layer; forming a stand-off on the second surface of the device layer; and establishing an electrical connection between the metal conductivity layer and a silicon substrate.

Further machine executable method operations can include: depositing a silicon layer or a silicon dioxide layer to form the stand-off; depositing a silicon dioxide layer to form a stand-off positioned on the piezoelectric layer; patterning and etching of the piezoelectric layer to form a sidewall; interposing a first dielectric layer between the piezoelectric layer and the metal conductive layer; disposing a second dielectric layer on the sidewall of the piezoelectric layer; exposing the device layer via a first opening in the handle layer; and exposing the piezoelectric layer through the first opening and a second opening in the device layer.

Additional machine executed method acts can also include: selectively removing a portion of the device layer; depositing an infra-red (IR) absorption layer on a selected portion of the device layer; and depositing an infra-red (IR) absorption layer on a selected portion of the piezoelectric layer.

In accordance with further embodiments the disclosure describes a micro-electro-mechanical device that can comprise: a first silicon substrate bonded to a second silicon substrate, comprising: an electrode on the second silicon substrate that electrically contacts a conductivity layer disposed on the first silicon substrate; the conductivity layer on the first silicon substrate is disposed over a piezoelectric layer on the first silicon substrate; the piezoelectric layer on the first silicon substrate is deposited over a device layer that comprises a stand-off formed on the first silicon substrate; and the device layer on the first silicon substrate is bonded to an dielectric layer that is deposited over a surface of a handle layer on the first silicon substrate that comprises a cavity.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified sub-components, some of the specified components or sub-components, and/ or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, may be provided to communicatively couple to such sub-components in order to provide integrated functionality. Any components described herein may also interact with one or more other components not specifically described herein.

In addition, while a particular feature of the subject disclosure may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A micro-electro-mechanical system device, comprising:
 a first silicon substrate comprising:
  a handle layer comprising a first surface and a second surface, the second surface comprises a cavity;
  an insulating layer deposited over the second surface of the handle layer;
  a device layer having a third surface bonded to the insulating layer and a fourth surface;
  a piezoelectric layer deposited over the fourth surface of the device layer;
  a metal conductivity layer disposed over the piezoelectric layer;
  a bond layer disposed over a portion of the metal conductivity layer; and
  a stand-off formed on the first silicon substrate;
 wherein the first silicon substrate is bonded to a complementary metal-oxide-semiconductor (CMOS) substrate, comprising:
  a metal electrode configured to form an electrical connection between the metal conductivity layer formed on the first silicon substrate and the CMOS substrate.

2. The device of claim 1, wherein the stand-off is formed on the piezoelectric layer.

3. The device of claim 1, wherein the stand-off is formed of a silicon layer or a silicon dioxide layer deposited on the device layer.

4. The device of claim 1, wherein the stand-off is formed of silicon dioxide deposited on the piezoelectric layer.

5. The device of claim 1, wherein the piezoelectric layer is patterned and etched to form a sidewall in the piezoelectric layer.

6. The device of claim 5, further comprising a first dielectric layer between the piezoelectric layer and the metal conductive layer.

7. The device of claim 6, further comprising a second dielectric layer disposed on the sidewall of the piezoelectric layer.

8. The device of claim 7, further comprising an opening in the handle layer to expose the device layer.

9. The device of claim 8, further comprising an orifice in the device layer to expose the piezoelectric layer.

10. The device of claim 8, further comprising an aperture in the device layer.

11. The device of claim 1, wherein the device layer is selectively or partially removed.

12. The device of claim 1, wherein the piezoelectric layer comprises aluminum nitride.

13. The device of claim 1, wherein the piezoelectric layer comprises: an aluminum nitride (AlN) seed layer, a bottom metal layer, and an aluminum nitride (AlN) layer.

14. The device of claim 1, further comprising an infra-red (IR) absorption layer deposited on a portion of the device layer.

15. The device of claim 1, further comprising an infra-red (IR) absorption layer deposited on a portion of the piezoelectric layer.

* * * * *